United States Patent
Li et al.

(10) Patent No.: US 11,810,963 B2
(45) Date of Patent: *Nov. 7, 2023

(54) GATE SPACER STRUCTURE OF FINFET DEVICE

(71) Applicant: Taiwan Semiconductor Manufacturing Co., Ltd., Hsinchu (TW)

(72) Inventors: Chung-Ting Li, Hsinchu (TW); Bi-Fen Wu, Taichung (TW); Jen-Hsiang Lu, Taipei (TW); Chih-Hao Chang, Chu-Bei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 221 days.

This patent is subject to a terminal disclaimer.

(21) Appl. No.: 17/328,046

(22) Filed: May 24, 2021

(65) Prior Publication Data

US 2021/0288162 A1    Sep. 16, 2021

Related U.S. Application Data

(60) Continuation of application No. 17/011,265, filed on Sep. 3, 2020, now Pat. No. 11,018,242, which is a
(Continued)

(51) Int. Cl.
*H01L 29/66* (2006.01)
*H01L 21/28* (2006.01)
(Continued)

(52) U.S. Cl.
CPC .... *H01L 29/66545* (2013.01); *H01L 21/2815* (2013.01); *H01L 21/823418* (2013.01);
(Continued)

(58) Field of Classification Search
CPC .......... H01L 29/66545; H01L 29/0649; H01L 29/41791; H01L 29/6653; H01L 29/6656;
(Continued)

(56) References Cited

U.S. PATENT DOCUMENTS 5,173,754 A    12/1992   Manning
8,247,285 B2 *  8/2012   Lin ..................... H01L 29/7833
                                                            438/300
(Continued)

FOREIGN PATENT DOCUMENTS

CN    103681347 A    3/2014
CN    105990280 A    10/2016
(Continued)

*Primary Examiner* — Lex H Malsawma
(74) *Attorney, Agent, or Firm* — Slater Matsil, LLP

(57) ABSTRACT

A method includes forming a fin extending above an isolation region. A sacrificial gate stack having a first sidewall and a second sidewall opposite the first sidewall is formed over the fin. A first spacer is formed on the first sidewall of the sacrificial gate stack. A second spacer is formed on the second sidewall of the sacrificial gate stack. A patterned mask having an opening therein is formed over the sacrificial gate stack, the first spacer and the second spacer. The patterned mask extends along a top surface and a sidewall of the first spacer. The second spacer is exposed through the opening in the patterned mask. The fin is patterned using the patterned mask, the sacrificial gate stack, the first spacer and the second spacer as a combined mask to form a recess in the fin. A source/drain region is epitaxially grown in the recess.

20 Claims, 40 Drawing Sheets

Related U.S. Application Data continuation of application No. 16/725,526, filed on Dec. 23, 2019, now Pat. No. 10,811,517, which is a continuation of application No. 16/419,292, filed on May 22, 2019, now Pat. No. 10,522,653, which is a division of application No. 15/726,074, filed on Oct. 5, 2017, now Pat. No. 10,319,832.

(60) Provisional application No. 62/491,716, filed on Apr. 28, 2017.

(51) Int. Cl.
  *H01L 29/06* (2006.01)
  *H01L 21/8234* (2006.01)
  *H01L 29/78* (2006.01)
  *H01L 27/088* (2006.01)
  *H01L 29/417* (2006.01)

(52) U.S. Cl.
  CPC ........ *H01L 21/823431* (2013.01); *H01L 21/823437* (2013.01); *H01L 21/823481* (2013.01); *H01L 27/0886* (2013.01); *H01L 29/0649* (2013.01); *H01L 29/41791* (2013.01); *H01L 29/6653* (2013.01); *H01L 29/6656* (2013.01); *H01L 29/6681* (2013.01); *H01L 29/66795* (2013.01); *H01L 29/785* (2013.01); *H01L 21/823468* (2013.01)

(58) Field of Classification Search
  CPC .......... H01L 29/66795; H01L 29/6681; H01L 29/785; H01L 21/2815; H01L 21/823418; H01L 21/823431; H01L 21/823437; H01L 21/823481; H01L 21/823468
  See application file for complete search history.

(56) References Cited

U.S. PATENT DOCUMENTS

| | | | |
|---|---|---|---|
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 10,164,069 B2 | 12/2018 | Ching et al. | |
| 10,319,832 B2 | 6/2019 | Li et al. | |
| 10,522,641 B2* | 12/2019 | Tsai | H01L 29/7833 |
| 10,522,653 B2* | 12/2019 | Li | H01L 29/66545 |
| 10,811,517 B2* | 10/2020 | Li | H01L 29/41791 |
| 2005/0287751 A1* | 12/2005 | Mehrad | H01L 29/6653 438/303 |
| 2006/0211200 A1* | 9/2006 | Tomita | H01L 21/823456 438/257 |
| 2009/0020822 A1* | 1/2009 | Nakanishi | H01L 21/823807 438/587 |
| 2010/0059801 A1 | 3/2010 | Kamei et al. | |
| 2012/0286376 A1* | 11/2012 | Hung | H01L 29/517 257/E21.409 |
| 2012/0309182 A1* | 12/2012 | Flachowsky | H01L 21/823425 438/587 |
| 2013/0256765 A1* | 10/2013 | Chang | H01L 29/7834 257/288 |
| 2013/0277686 A1* | 10/2013 | Liu | H01L 29/6653 257/77 |
| 2014/0065782 A1 | 3/2014 | Lu et al. | |
| 2014/0332883 A1* | 11/2014 | Kwon | H01L 27/0266 257/336 |
| 2014/0353741 A1 | 12/2014 | Montanini et al. | |
| 2015/0243751 A1* | 8/2015 | Liu | H01L 21/76897 438/666 |
| 2016/0056232 A1 | 2/2016 | Kuo et al. | |
| 2016/0093726 A1 | 3/2016 | Ching et al. | |
| 2016/0111430 A1 | 4/2016 | Liaw | |
| 2016/0149017 A1* | 5/2016 | Tsai | H01L 21/28247 257/288 |
| 2016/0365426 A1 | 12/2016 | Ching et al. | |
| 2017/0154968 A1* | 6/2017 | Park | H01L 23/5226 |
| 2017/0278865 A1 | 9/2017 | Ching et al. | |

FOREIGN PATENT DOCUMENTS

| | | |
|---|---|---|
| CN | 105990346 A | 10/2016 |
| CN | 106252410 A | 12/2016 |
| KR | 20140029094 A | 3/2014 |
| KR | 20160044993 A | 4/2016 |
| TW | 201608716 A | 3/2016 |
| TW | 201644053 A | 12/2016 |

\* cited by examiner

GATE SPACER STRUCTURE OF FINFET DEVICE

PRIORITY CLAIM AND CROSS-REFERENCE

This application is a continuation of U.S. application Ser. No. 17/011,265, filed on Sep. 3, 2020, now U.S. Pat. No. 11,018,242, issued on May 25, 2021, entitled "Gate Spacer Structure of FinFET Device," which is a continuation of U.S. application Ser. No. 16/725,526, filed on Dec. 23, 2019, now U.S. Pat. No. 10,811,517, issued on Oct. 20, 2020 entitled "Gate Spacer Structure of FinFET Device," which is a continuation of U.S. application Ser. No. 16/419,292, filed on May 22, 2019, now U.S. Pat. No. 10,522,653, issued on Dec. 31, 2019, entitled "Gate Spacer Structure of FinFET Device," which is a divisional of U.S. application Ser. No. 15/726,074, filed on Oct. 5, 2017, entitled "FinFET Device and Method of Forming Same," now U.S. Pat. No. 10,319,832, which claims the benefit of U.S. Provisional Application No. 62/491,716, filed on Apr. 28, 2017, entitled "FinFET Device and Method of Forming Same," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-6A are cross-sectional views of intermediate stages in the manufacture of a FinFET device in accordance with some embodiments.

DETAILED DESCRIPTION

Figure 1:
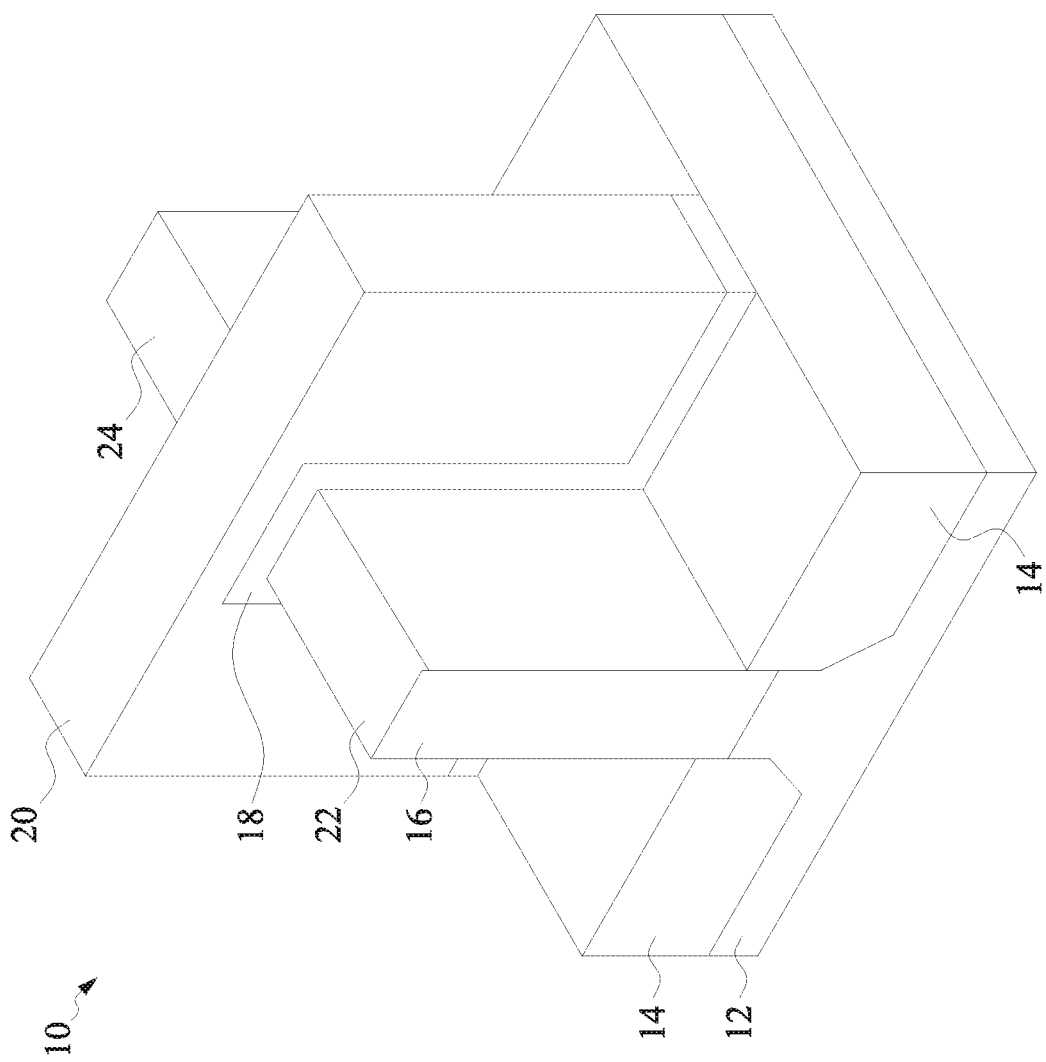
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for forming a FinFET device that is configured to function as an electrostatic discharge (ESD) protection device, and improving ESD protection proprieties of such an ESD protection device. Various embodiments presented herein are discussed in the context of a FinFET device formed using a gate-last process. In other embodiments, a gate-first process may be used. Also, some embodiments contemplate aspects used in planar devices, such as planar FET devices.

FIG. 1 illustrates an example of a fin field-effect transistor (FinFET) 10 in a three-dimensional view. The FinFET 10 comprises a fin 16 on a substrate 12. The substrate 12 includes isolation regions 14, and the fin 16 protrudes above and from between neighboring isolation regions 14. A gate dielectric 18 is along sidewalls and over a top surface of the fin 16, and a gate electrode 20 is over the gate dielectric 18. Source/drain regions 22 and 24 are disposed in opposite sides of the fin 16 with respect to the gate dielectric 18 and gate electrode 20. The FinFET 10 illustrated in FIG. 1 is provided for illustrative purposes only and is not meant to limit the scope of the present disclosure. As such, many variations are possible, such as epitaxial source/drain regions, multiple fins, multilayer fins, etc.

Figure 2:
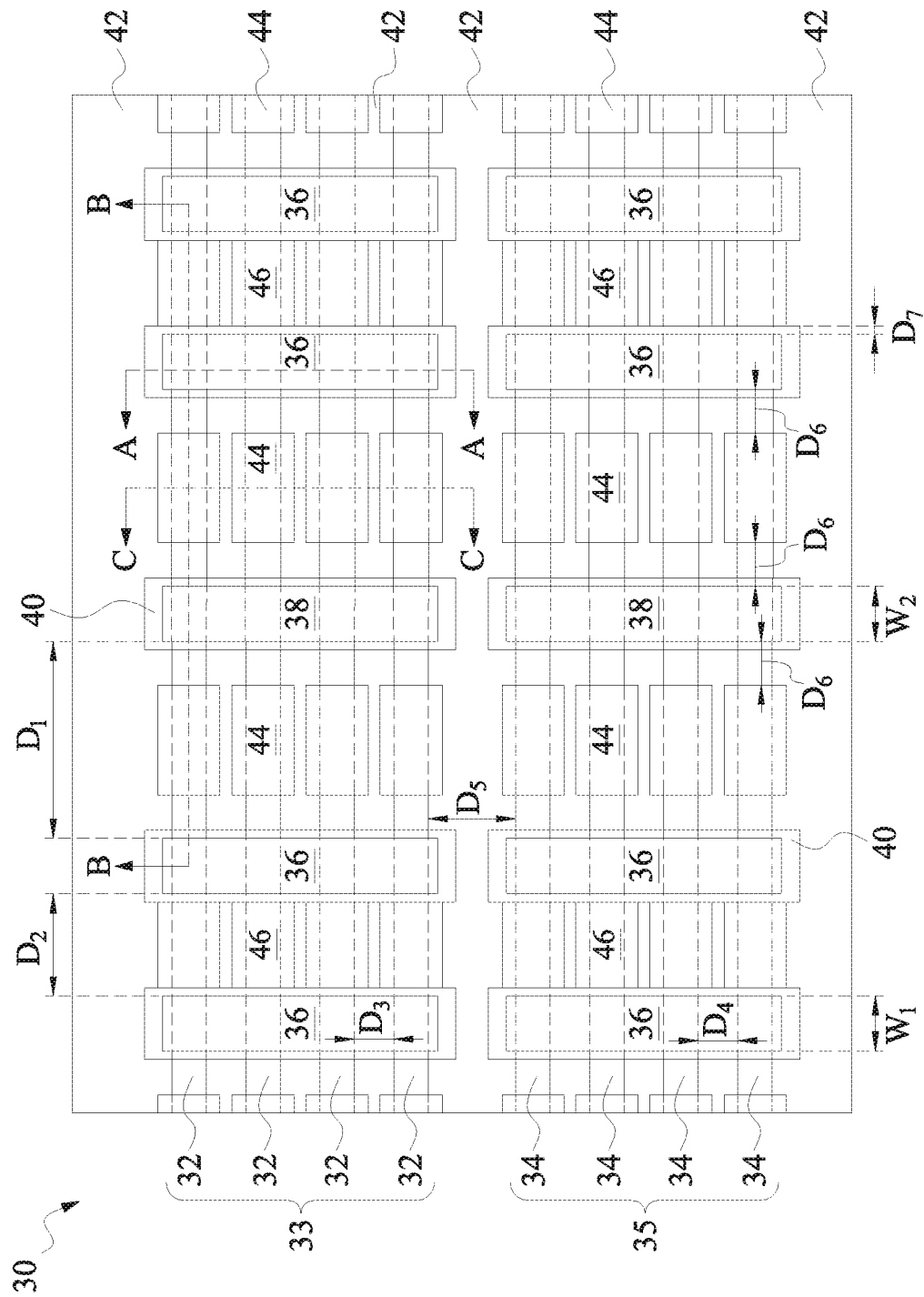
FIG. 2 is a top view of a FinFET device in accordance with some embodiments.

FIG. 2 is a top view of a FinFET device 30 in accordance with some embodiments. In some embodiments, the FinFET device 30 may comprise a plurality of FinFETs, such as the FinFET 10 illustrated in FIG. 1, except each gate of the FinFET device 30 extends along sidewalls and over top surfaces of a plurality of fins. The FinFET device 30 comprises a plurality of fin groups, such as fin groups 33 and 35. The fin group 33 comprises a plurality of fins 32. The fin group 35 comprises a plurality of fins 34. In some embodiments, a distance $D_3$ between adjacent fins 32 of the fin group 33 may be substantially same as a distance $D_4$ between adjacent fins 34 of the fin group 35. In some embodiments, a distance $D_5$ between adjacent fin groups, such as the fin group 33 and the fin group 35, may be greater than the distance $D_3$ and the distance $D_4$. In some embodiments, the distance $D_3$ may be between about 22 nm and about 26 nm. In some embodiments, the distance $D_4$ may be between about 22 nm and about 26 nm. In some embodiments, the distance $D_5$ may be between about 180 nm and about 300 nm. In some embodiments, a ratio $D_3/D_5$ may be between about 0.7 and about 0.15. In some embodiments, a ratio $D_4/D_5$ may be between about 0.7 and about 0.15. By choosing these values for the ratios $D_3/D_5$ and $D_4/D_5$, good isolation between the fin group 33 and the fin group 35 is achieved. In the illustrated embodiment, the FinFET device 30 comprises two fin groups, such as the fin groups 33 and 35. In other embodiments, the number of fin groups may be less than two or more than two according to design requirements of the FinFET device 30. In the illustrated embodiment, each of the fin groups 33 and 35 includes four fins. In other embodiments, the number of fins in each of the fin groups 33 and 35 may include less than four or more than four fins according to design requirements of the FinFET device 30.

The FinFET device 30 further includes isolation regions 42, such that each of the fins 32 and 34 protrudes above and from between neighboring isolation regions 42. The FinFET device 30 further includes a plurality of gates 36 and a plurality of gates 38, such that each of the gates 36 and 38 extends along sidewalls and over top surfaces of respective one of the fin groups 33 and 35. In some embodiments, the gates 36 are active gates and the gates 38 are dummy gates, such that the gates 38 do not function as gates to modulate conductivities of underlying channel regions of respective ones of the fins 32 and 34. Accordingly, the gates 36 may also be referred to as active gates 36, and the gates 38 may also be referred to as dummy gates 38. In the illustrated embodiments, each of the dummy gates 38 is interposed between adjacent pairs of the active gates 36. In other embodiments, the numbers of the active gates 36 and the dummy gates 38, and their arrangement may vary according to design requirements of the FinFET device 30. In some embodiments, a width $W_1$ of the active gates 36 is greater than a width $W_2$ of the dummy gates 38. In other embodiments, a relative width of the dummy gates 38 with respect to the width of the active gates 36 may be altered according to design requirements of the FinFET device 30. In some embodiments, the width $W_1$ may be between about 150 nm and about 170 nm. In some embodiments, the width $W_2$ may be between about 100 nm and about 120 nm. In some embodiments, a ratio $W_2/W_1$ may be between about 0.58 and about 0.8. In some embodiments, a distance $D_1$ between a dummy gate 38 and a nearest active gate 36 is greater than a distance $D_2$ between adjacent active gates 36. In some embodiments, the distance $D_1$ may be between about 168 nm and about 232 nm. In some embodiments, the distance $D_2$ may be between about 60 nm and about 80 nm. In some embodiments, a ratio $D_2/D_1$ may be between about 0.25 and about 0.47. In other embodiments, various distances between gates 36 and 38 may be altered according to design requirements of the FinFET device 30.

The FinFET device 30 further includes spacers 40 that extend along sidewalls of the active gates 36 and sidewalls of the dummy gates 38. In some embodiments, the spacers 40 have a width between about 5 nm and about 10 nm. The FinFET device 30 comprises epitaxial source/drain regions 44 and 46, such that each of the active gates 36 is interposed between a respective one of the epitaxial source/drain regions 44 and a respective one of the epitaxial source drain/regions 46, and each of the dummy gates 38 is interposed between respective adjacent epitaxial source/drain regions 44.

In some embodiments, each of the active gates 36 has an asymmetric source/drain configuration, such that a respective epitaxial source/drain region 46 is spaced apart from the active gate 36 by a shorter distance than a respective epitaxial source/drain region 44. In some embodiments, each of the dummy gates 38 has a symmetric source/drain configuration, such that both respective epitaxial source/drain regions 44 are spaced apart from the dummy gate 38 by a same distance. In some embodiments, each of the epitaxial source/drain regions 46 is spaced apart from a respective active gate 36 by a distance $D_7$ that equals to the width of a respective spacer 40. In some embodiments, each of the epitaxial source/drain regions 44 is spaced apart from a respective dummy gate 38 and a respective active gate 36 by a distance $D_6$ that is greater than the distance $D_7$. In some embodiments, the distance $D_6$ may be between about 30 nm and about 40 nm. In some embodiments, the distance $D_7$ may be between about 5 nm and about 10 nm. In some embodiments, a ratio $D_7/D_6$ may be between about 0.12 and about 0.33.

FIG. 2 further illustrates reference cross-sections that are used in subsequent figures. Cross-section A-A is along a longitudinal axis of an active gate 36 of the FinFET device 30. Cross-section C-C is in a plane that is parallel to cross section A-A and is across an epitaxial source/drain region 44. Cross-section B-B is perpendicular to cross-section A-A and is along a longitudinal axis of a fin 32 and in a direction of, for example, a current flow between the epitaxial source/drain regions 44 and 46. Subsequent figures refer to these reference cross-sections for clarity.

FIGS. 3A through 16A-C are cross-sectional views of intermediate stages in the manufacturing of a FinFET device, such as the FinFET device 30 illustrated in FIG. 2, in accordance with some embodiment. In FIGS. 3A through 16A-C, figures ending with an "A" designation are illustrated along the reference cross-section A-A illustrated in FIG. 2; figures ending with a "B" designation are illustrated along the reference cross-section B-B illustrated in FIG. 2; and figures ending with a "C" designation are illustrated along the cross-section C-C illustrated in FIG. 2.

Figure 3A:
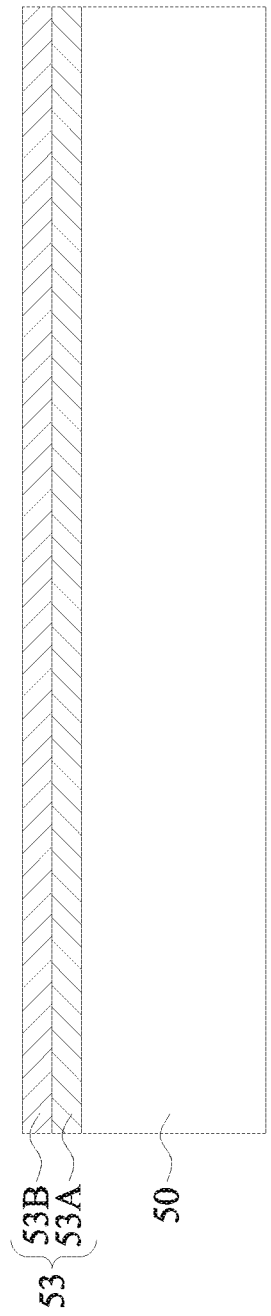

FIG. 3A illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; combinations thereof; or the like.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFET device. The integrated circuit devices may be formed using any suitable methods.

In some embodiments, appropriate wells (not shown) may be formed in the substrate 50. In some embodiments wherein the resulting FinFET device is an n-type device, the wells are p-wells. In some embodiments wherein the resulting FinFET device is a p-type device, the wells are n-wells. In other embodiments, both p-wells and n-wells are formed in the substrate 50. In some embodiments, p-type impurities are implanted into the substrate 50 to form the p-wells. The p-type impurities may be boron, $BF_2$, or the like, and may be implanted to a concentration of equal to or less than $10^{18}$ $cm^{-3}$, such as in a range from about $10^{17}$ $cm^{-3}$ to about $10^{18}$ $cm^{-3}$. In some embodiments, n-type impurities are implanted into the substrate 50 to form the n-wells. The n-type impurities may be phosphorus, arsenic, or the like, and may be implanted to a concentration of equal to or less than $10^{18}$ $cm^{-3}$, such as in a range from about $10^{17}$ $cm^{-3}$ to about $10^{18}$ $cm^{-3}$. After implanting the appropriate impurities, an anneal may be performed on the substrate to activate the p-type and n-type impurities that were implanted.

FIG. 3A further illustrates the formation of a mask 53 over the substrate 50. In some embodiments, the mask 53 may be used in a subsequent etching step to pattern the substrate 50 (see FIG. 4A). As shown in FIG. 3A, the mask 53 may include a first mask layer 53A and a second mask layer 53B. The first mask layer 53A may be a hard mask layer, may comprise silicon oxide, silicon nitride, silicon oxynitride, silicon carbide, silicon carbonitride, a combination thereof, or the like, and may be formed using any suitable process, such as thermal oxidation, thermal nitridation, atomic layer deposition (ALD), physical vapor deposition (PVD), chemical vapor deposition (CVD), a combination thereof, or the like. The first mask layer 53A may be used to prevent or minimize etching of the substrate 50 underlying the first mask layer 53A in the subsequent etch step (see FIG. 4A). The second mask layer 53B may comprise photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may comprise three or more mask layers.

Figure 4A:
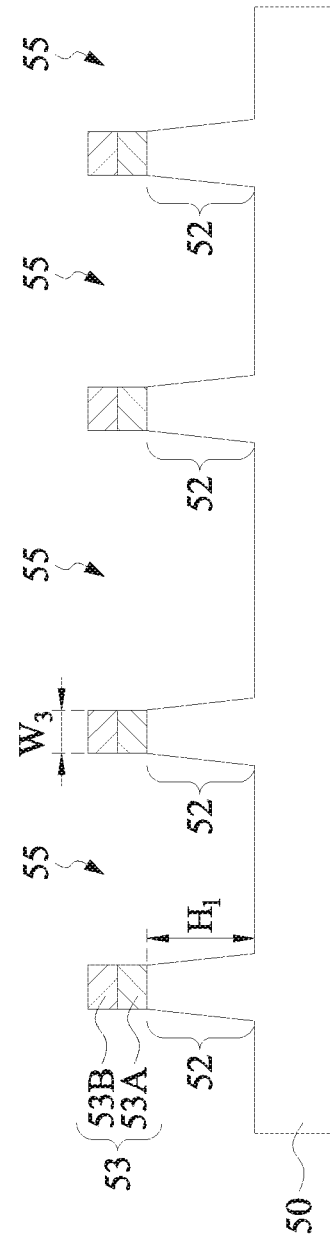

FIG. 4A illustrates the formation of semiconductor strips 52 in the substrate 50. First, mask layers 53A and 53B may be patterned, where openings in mask layers 53A and 53B expose areas of the substrate 50 where trenches 55 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), the like, or a combination thereof. The etch process may be anisotropic. In some embodiments, after forming the semiconductor strips 52, any remaining portions of the mask 53 may be removed by any suitable process. In other embodiments, portions of the mask 53, such as the first mask layer 53A, may remain over the semiconductor strips 52. In some embodiments, the semiconductor strips 52 may have a height $H_1$ between about 45 nm and about 65 nm, and a width $W_3$ between about 5 nm and about 7 nm.

In some embodiments, the semiconductor strips 52 may be formed by any suitable method. For example, the semiconductor strips 52 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the substrate 50 and patterned using a photolithography process. Spacers are formed alongside the patterned sacrificial layer using a self-aligned process. The sacrificial layer is then removed, and the remaining spacers, or mandrels, may then be used to pattern the substrate to form the semiconductor strips 52.

Figure 5A:
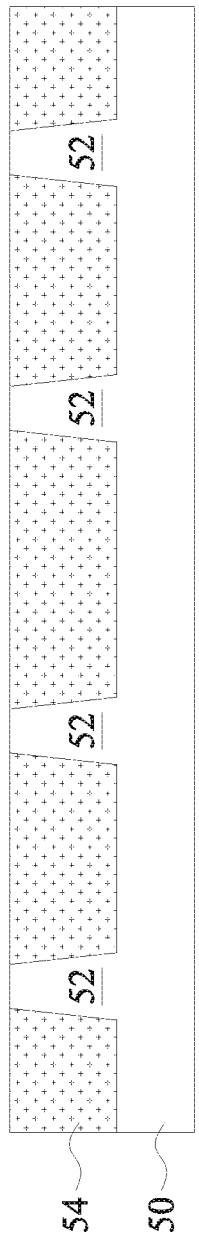

FIG. 5A illustrates the formation of an insulation material in the trenches 55 (see FIG. 4A) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a conformal liner (not illustrated) formed on sidewalls and bottom surfaces of the trenches 55 (see FIG. 4A) prior to the filling of the trenches 55 with an insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer, combinations thereof, or the like. The formation of the liner may include any suitable method, such as ALD, CVD, HDP-CVD, PVD, a combination thereof, or the like. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. In some embodiments, after the insulation material of the isolation regions 54 are deposited, an annealing process may be performed on the insulation material of the isolation regions 54.

Referring further to FIG. 5A, a planarization process, such as a chemical mechanical polishing (CMP), may remove any excess insulation material of the isolation regions 54, such that top surfaces of the isolation regions 54 and top surfaces of the semiconductor strips 52 are coplanar. In some embodiments where portions of the mask 53 remain over the semiconductor strips 52 after forming the semiconductor strips 52, the CMP may also remove the remaining portions of the mask 53.

Figure 6A:
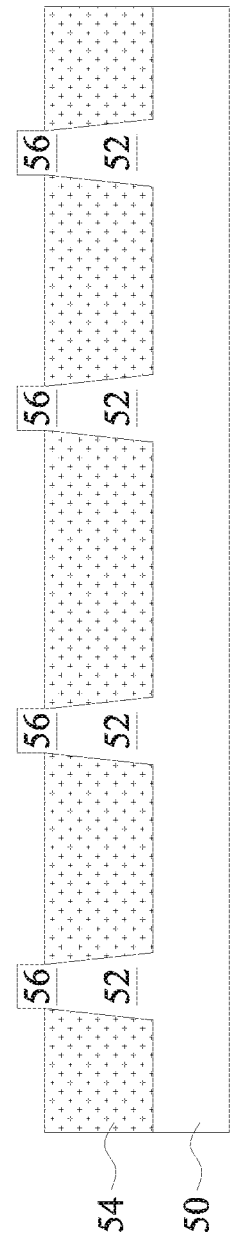

FIG. 6A illustrates the recessing of the isolation regions 54 to form Shallow Trench Isolation (STI) regions 54. The isolation regions 54 are recessed such that fins 56 protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch, an Applied Materials SICONI tool, or dilute hydrofluoric (dHF) acid may be used.

A person having ordinary skill in the art will readily understand that the process described with respect to FIGS. 3A through 6A is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 5A can be recessed, and one or more materials different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using one or more materials different from the substrate 50; and the dielectric layer can be recessed such that the heteroepitaxial structures protrude from the dielectric layer to form fins 56.

In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. In various embodiments, the fins 56 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 7A:
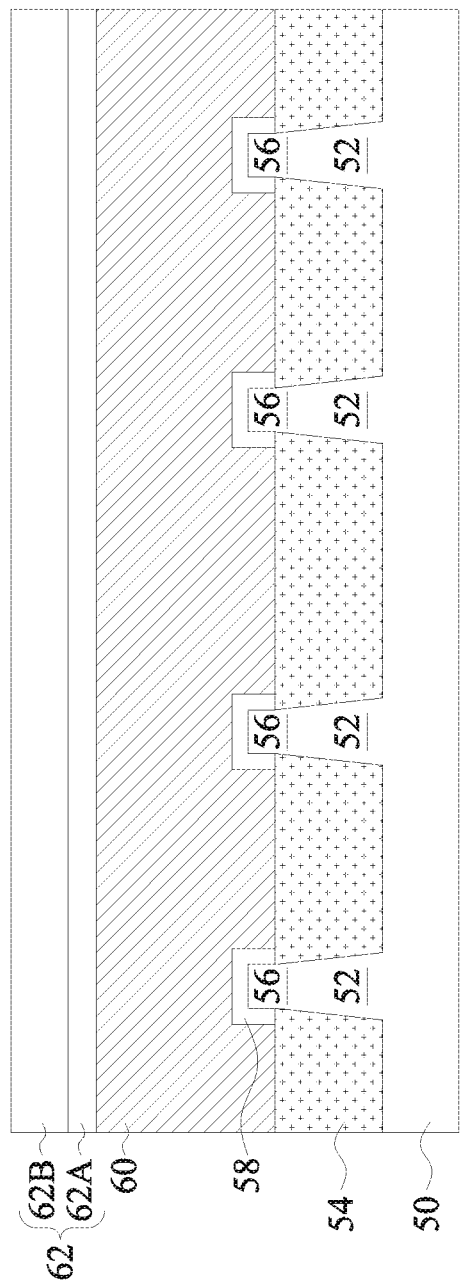
FIGS. 7A and 7B are cross-sectional views of intermediate stages in the manufacture of a FinFET device in accordance with some embodiments.
Figure 7B:
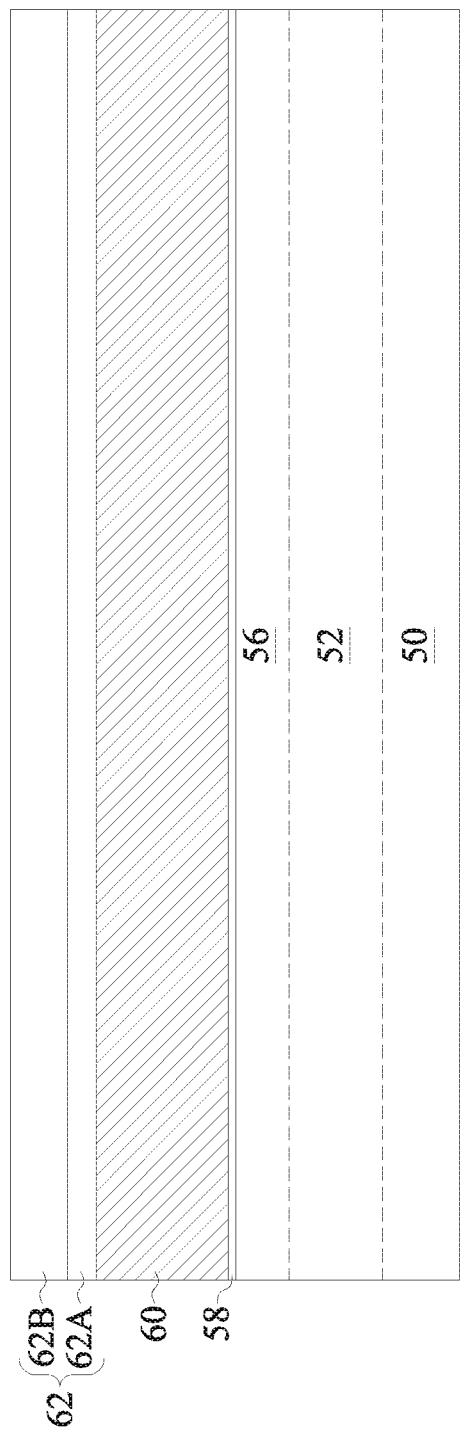

Referring to FIGS. 7A and 7B, a dielectric layer 58 is formed on the fins 56. The dielectric layer 58 may be, for example, silicon oxide, silicon nitride, a combination thereof, or the like, and may be deposited (using, for example, ALD, CVD, PVD, a combination thereof, or the like) or thermally grown (for example, using thermal oxidation, or the like) according to acceptable techniques. A gate electrode layer 60 is formed over the dielectric layer 58, and a mask 62 is formed over the gate electrode layer 60. In other embodiments, the dielectric layer 58 may be omitted and the gate electrode layer 60 may be formed directly on the fins 56. In some embodiments, the gate electrode layer 60 may be deposited over the dielectric layer 58 and then planarized using, for example, a CMP process. The mask 62 may be deposited over the gate electrode layer 60. The gate electrode layer 60 may be made of, for example, polysilicon, although other materials that have a high etching selectivity with respect to the material of the isolation regions 54 may also be used. The mask 62 may include one or more layers of, for example, silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like. In an embodiment, the mask 62 comprises a first mask layer 62A formed of silicon oxide and a second mask layer 62B formed of silicon nitride. In some embodiments, the first mask layer 62A may have a thickness between about 15 nm and about 25 nm, and the second mask layer 62B may have a thickness between about 50 nm and about 70 nm.

Figure 8A:
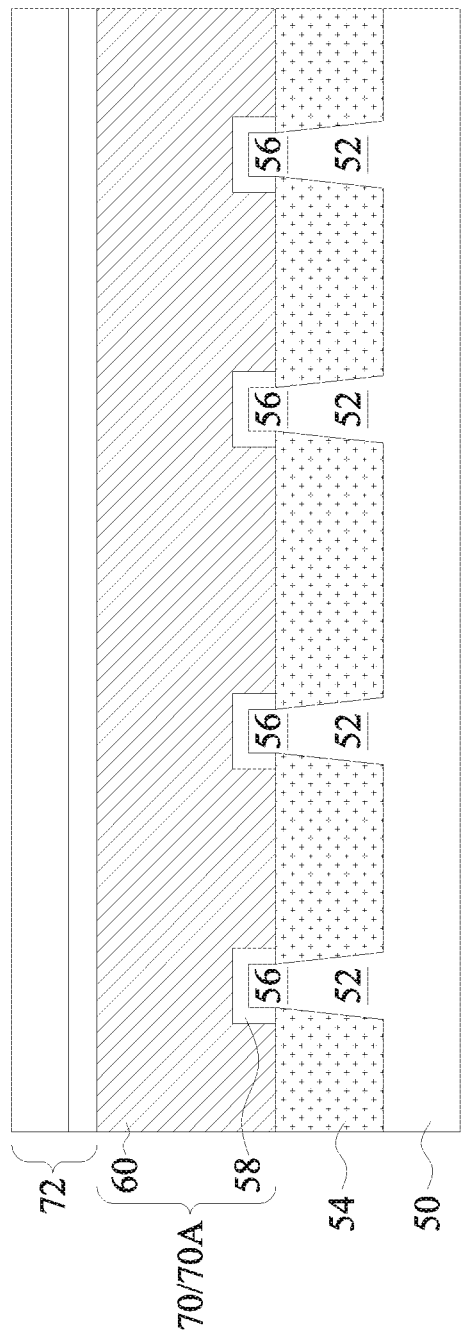
FIGS. 8A, 8B and 8C are cross-sectional views of intermediate stages in the manufacture of a FinFET device in accordance with some embodiments.
Figure 8B:
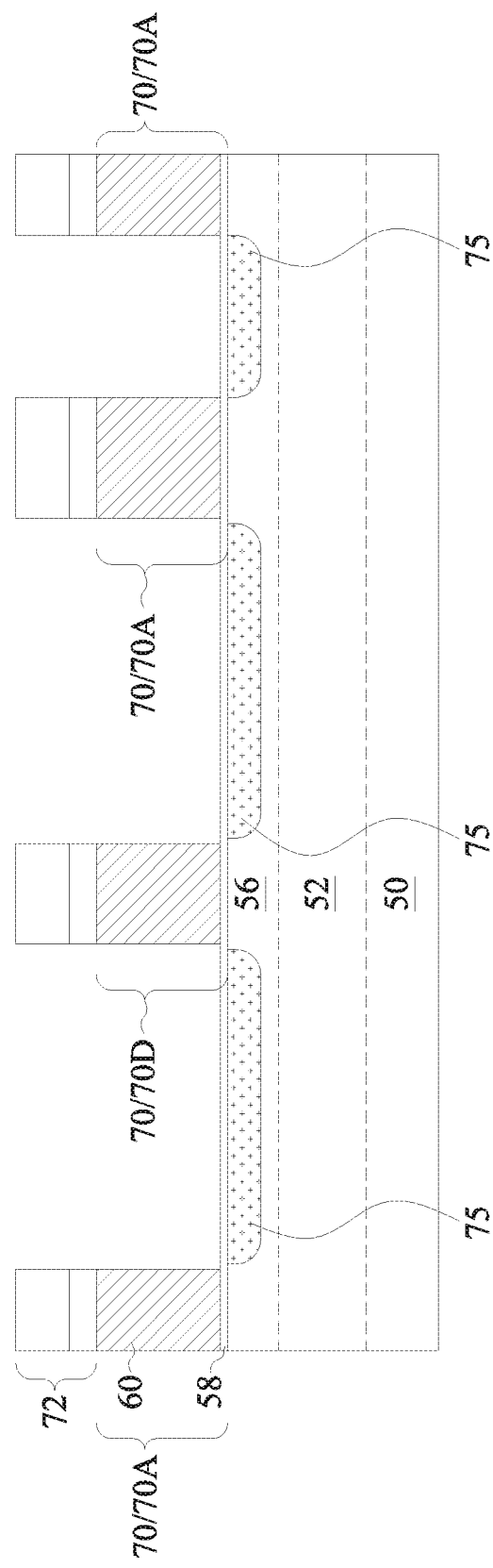
Figure 8C:
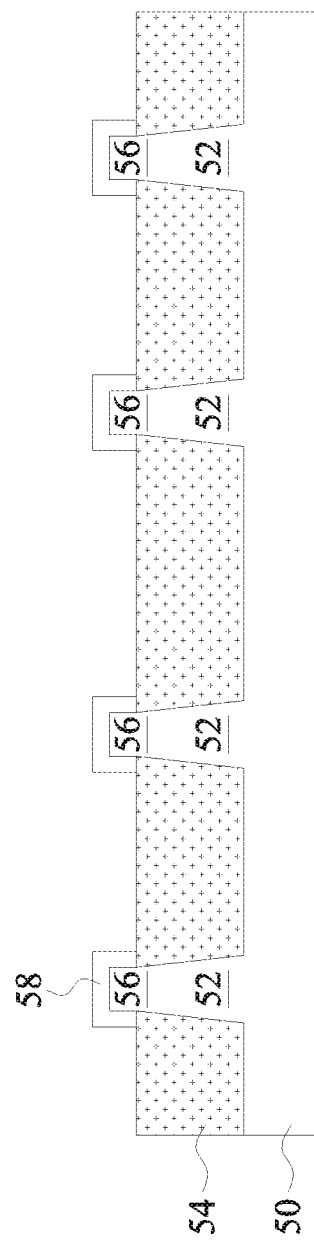

Referring to FIGS. 8A, 8B, and 8C, the mask 62 (see FIGS. 7A and 7B) may be patterned using acceptable photolithography and etching techniques to form a patterned mask 72. The pattern of the patterned mask 72 is transferred to the gate electrode layer 60 by an acceptable etching technique to form gates 70. Optionally, the pattern of the patterned mask 72 may similarly be transferred to the dielectric layer 58. The pattern of the gates 70 cover respective channel regions of the fins 56 while exposing source/drain regions of the fins 56. The gates 70 may also have a lengthwise direction substantially perpendicular to the lengthwise direction of respective fins 56, within process variations. A size of the gates 70, and a pitch between the gates 70, may depend on a region of a die in which the gates 70 are formed. In some embodiments, the gates 70 may have a larger size and a larger pitch when located in, for example, an input/output region of a die (e.g., where input/output circuitry is disposed) than when located in, for example, a logic region of a die (e.g., where logic circuitry is disposed).

As described below in greater detail, the gates 70 are sacrificial gates and are subsequently replaced by replacement gates. Accordingly, the gates 70 may also be referred to as sacrificial gates 70. In some embodiments, some of the replacement gates are active gates and some of the replacement gates are dummy gates. In some embodiments, the sacrificial gates 70A are replaced by active replacement gates and the sacrificial gates 70D are replaced by dummy replacement gates. In some embodiments, a width of the sacrificial gates 70D is less than a width of the sacrificial gates 70A.

Referring further to FIGS. 8A, 8B, and 8C, lightly doped source/drain (LDD) regions 75 may be formed in the substrate 50. Similar to the implantation process discussed above with reference to FIG. 3A, appropriate impurities are implanted into the fins to form the LDD regions 75. In some embodiments wherein the resulting FinFET device is a p-type device, p-type impurities are implanted into the fins 56 to form p-type LDD regions 75. In some embodiments wherein the resulting FinFET device is an n-type device, n-type impurities are implanted into the fins 56 to form n-type LDD regions 75. During the implantation of the LDD regions 75, the sacrificial gates 70 and the patterned mask 72 may act as a mask to prevent (or at least reduce) dopants from implanting into channel regions of the exposed fins 56. Thus, the LDD regions 75 may be formed substantially in source/drain regions of the exposed fins 56. The n-type impurities may be any of the n-type impurities previously discussed, and the p-type impurities may be any of the p-type impurities previously discussed. The LDD regions 75 may have a concentration of impurities between about $10^{15}$ $cm^{-3}$ to about $10^{16}$ $cm^{-3}$. After the implantation process, an annealing process may be performed to activate the implanted impurities.

Figure 9A:
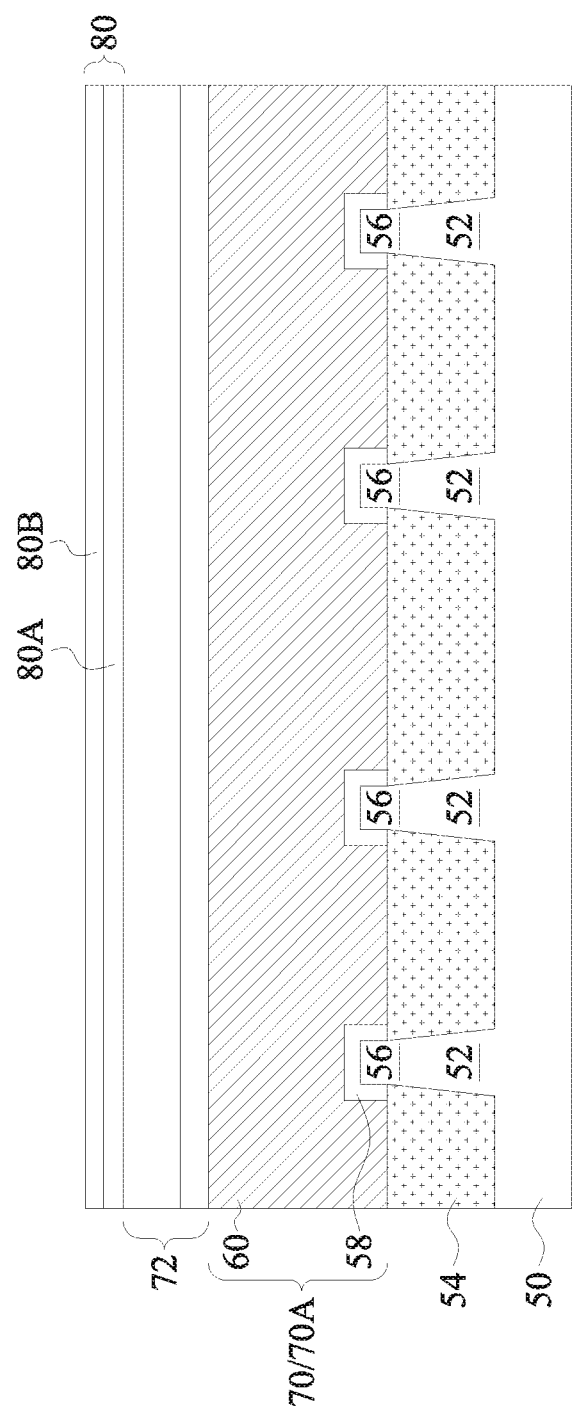
FIGS. 9A, 9B and 9C are cross-sectional views of intermediate stages in the manufacture of a FinFET device in accordance with some embodiments.
Figure 9B:
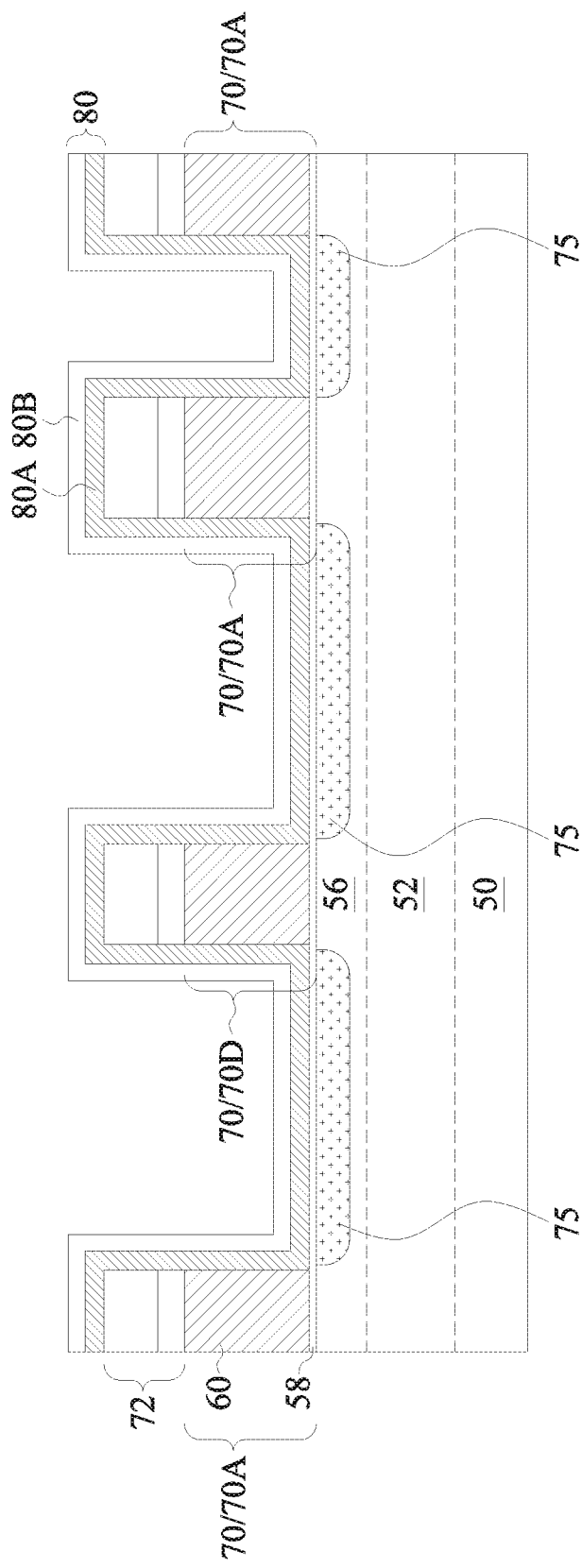
Figure 9C:
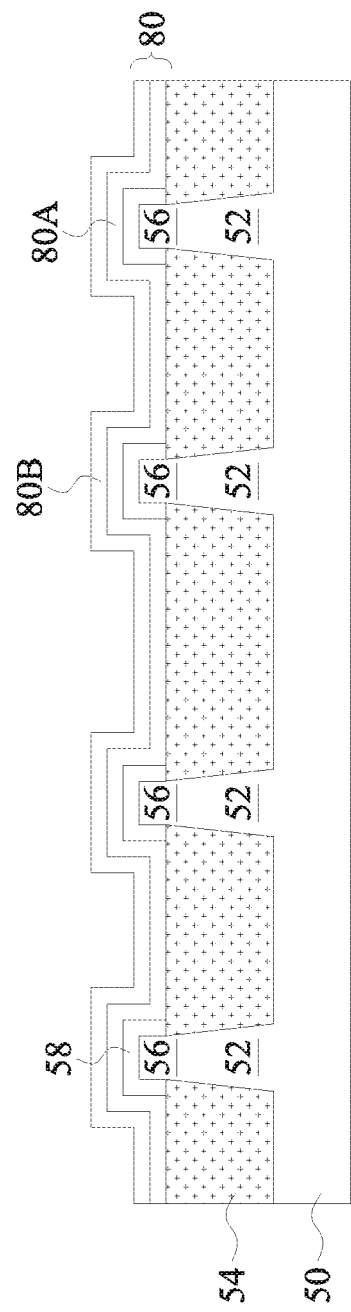

Referring to FIGS. 9A, 9B, and 9C, a spacer layer 80 is formed on exposed surfaces of the sacrificial gates 70 (see FIG. 9B) and/or the dielectric layer 58 over the fins 56 (see FIG. 9C). Any suitable methods of forming the spacer layer 80 may be used. In some embodiments, a deposition (such as CVD, ALD, or the like) may be used form the spacer layer 80. In some embodiments, the spacer layer 80 may include one or more layers of, for example, silicon nitride (SiN), silicon oxynitride, silicon carbonitride, silicon oxycarbonitride (SiOCN), a combination thereof, or the like. In some embodiments, the spacer layer 80 may comprise a first spacer layer 80A and a second spacer layer 80B over the first spacer layer 80A. In some embodiments, the first spacer layer 80A may be formed of materials comprising Si, O, C, N, or combinations thereof. In some embodiments, the second spacer layer 80B may be formed of materials comprising Si, O, C, N, or combinations thereof. In some embodiments, the first spacer layer 80A and the second spacer layer 80B are formed of different materials. In some embodiment, the first spacer layer 80A may comprise a first dielectric layer and a second dielectric layer over the first dielectric layer. In some embodiments, the first dielectric layer comprises a dielectric material having a k-value between about 5 and about 7. In some embodiments, the first dielectric layer has a thickness between about 1 nm and about 3 nm. In some embodiments, the second dielectric layer comprises a dielectric material having a k-value between about 5 and about 7. In some embodiments, the second dielectric layer has a thickness between about 2 nm and about 4 nm. In some embodiments, the second spacer layer 80B has a thickness between about 6 nm and about 7 nm.

Figure 10A:
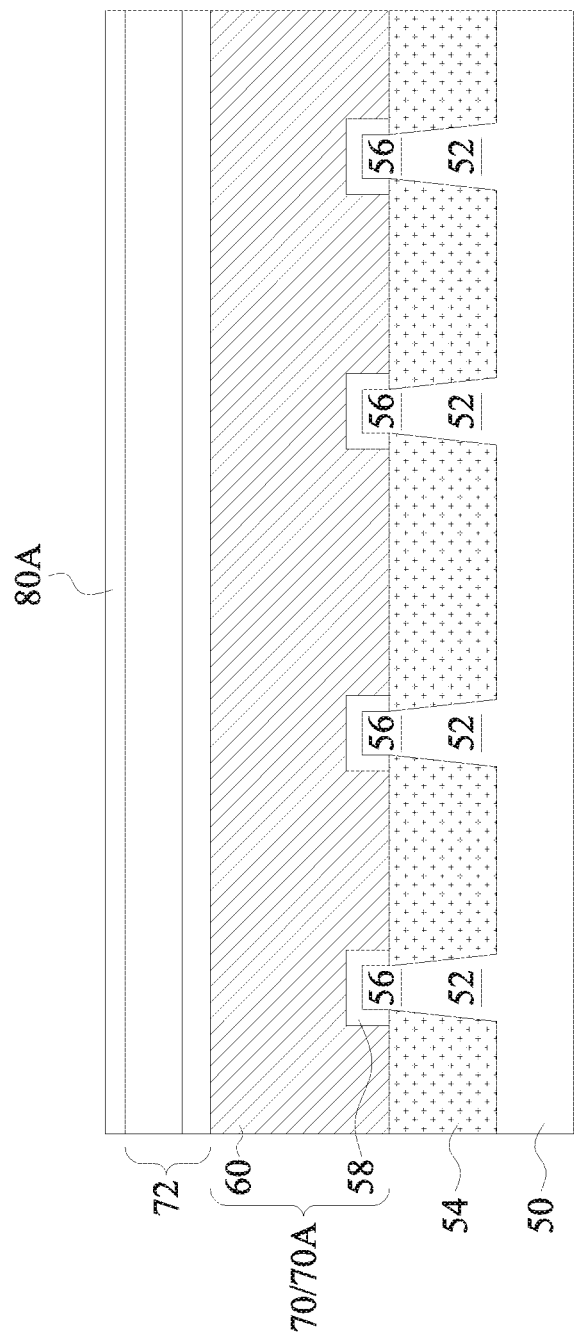
FIGS. 10A, 10B and 10C are cross-sectional views of intermediate stages in the manufacture of a FinFET device in accordance with some embodiments.
Figure 10B:
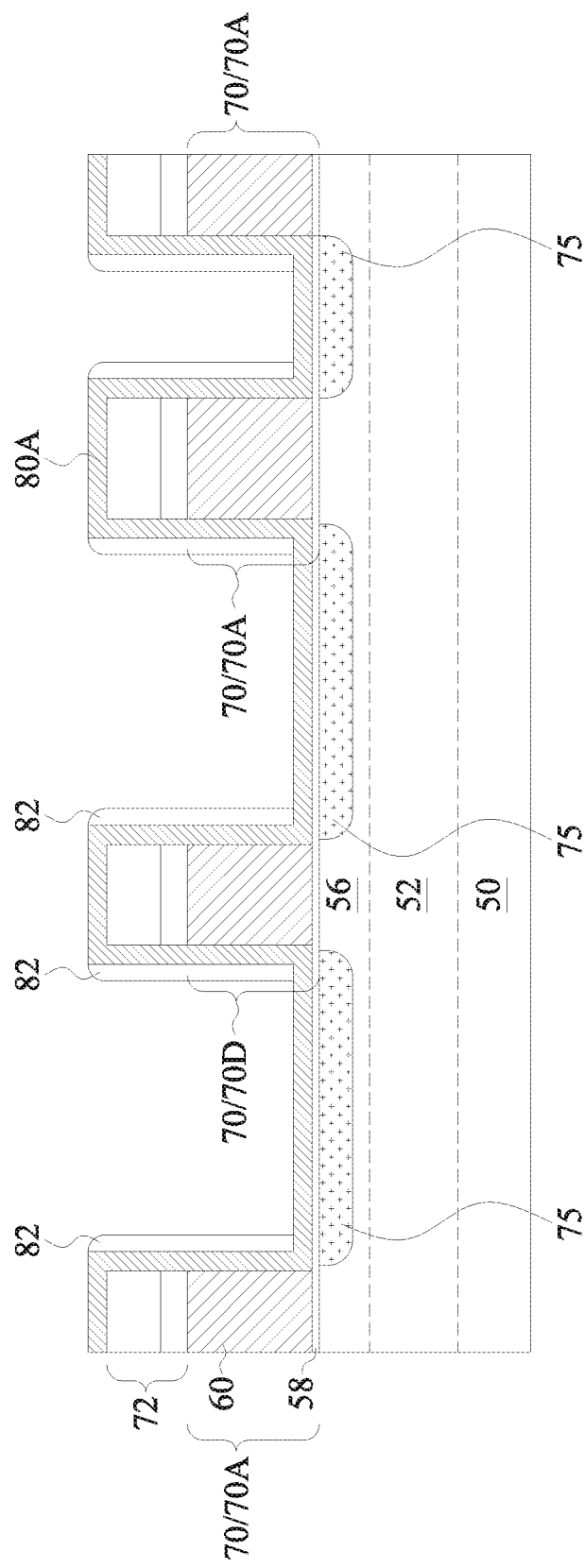
Figure 10C:
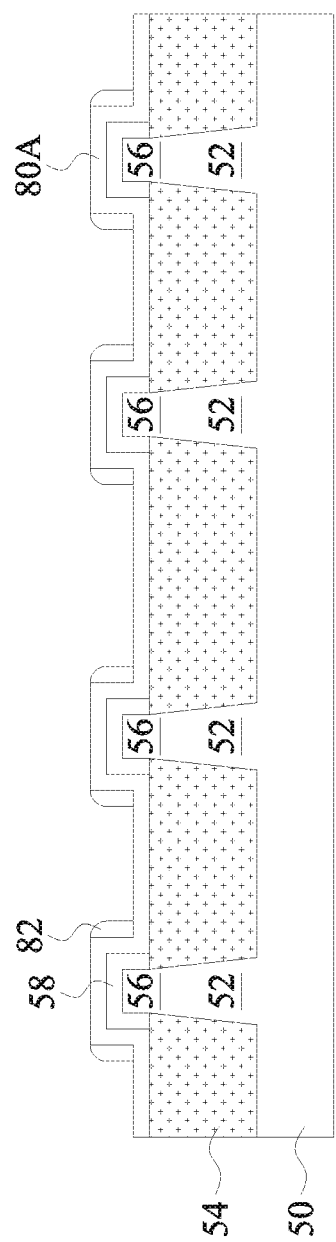

Referring to FIGS. 10A, 10B, and 10C, horizontal portions of the second spacer layer 80B are removed, such that remaining vertical portions of the second spacer layer 80B form spacers 82. In some embodiments, horizontal portions of the second spacer layer 80B are removed using a suitable anisotropic etching process. In other embodiments, vertical portions of the second spacer layer 80B extending along sidewalls of the fins 56 may also be removed.

Figure 11A:
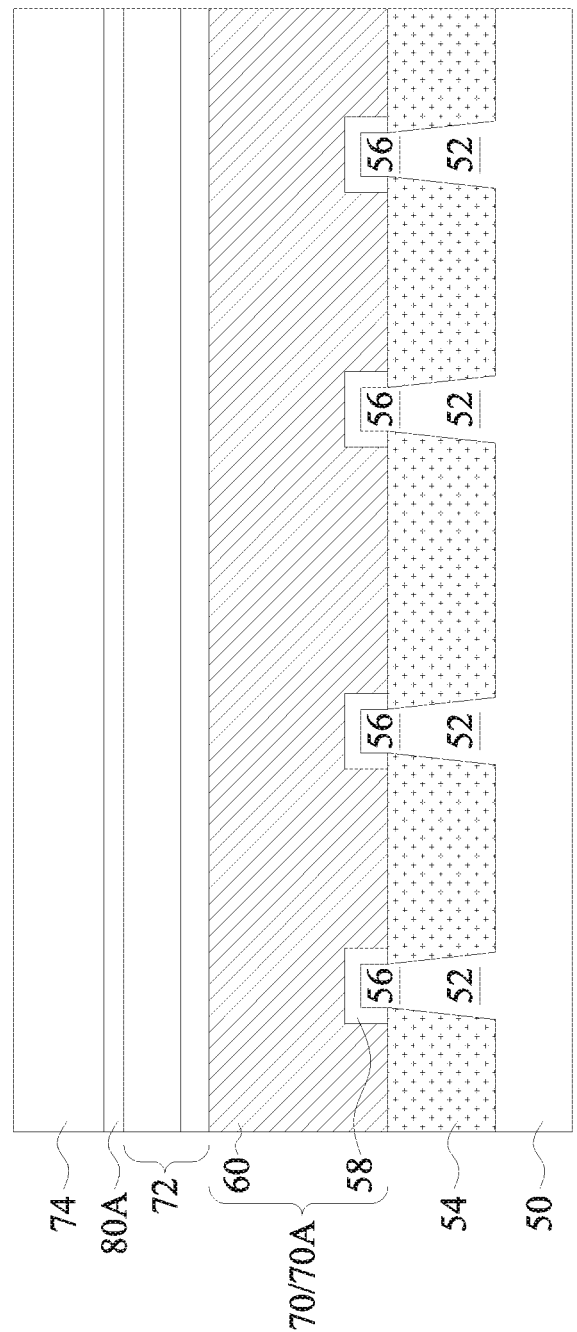
FIGS. 11A, 11B and 11C are cross-sectional views of intermediate stages in the manufacture of a FinFET device in accordance with some embodiments.
Figure 11B:
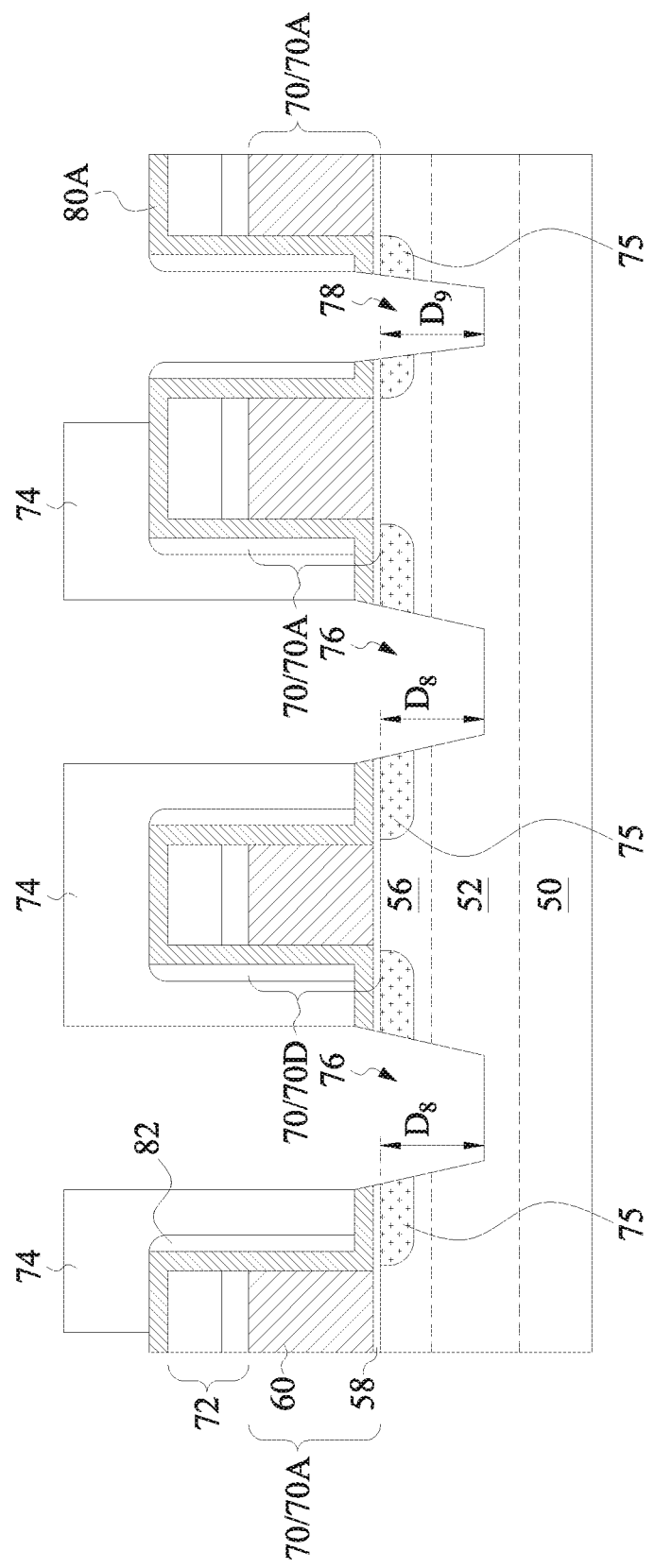
Figure 11C:
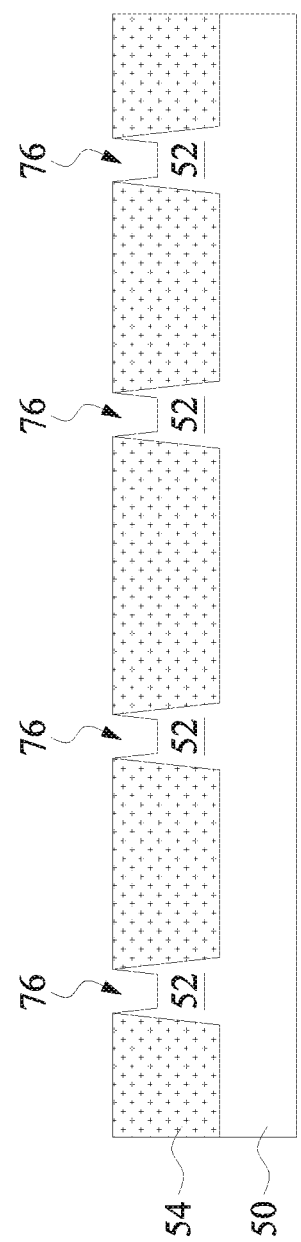

Referring to FIGS. 11A, 11B, and 11C, a patterned mask 74 is formed over the sacrificial gates 70. In some embodiments, the patterned mask 74 exposes regions of the fins 56 between adjacent sacrificial gates 70, where epitaxial source/drain regions of the resulting FinFET device are subsequently formed. In some embodiments, the patterned mask 74 may comprise a photoresist material and may be patterned using suitable photolithography processes. In some embodiments, the patterned mask 74 exposes entire regions of the fins 56 interposed between adjacent sacrificial gates 70A, and exposes portions of regions of the fins 56 interposed between adjacent sacrificial gates 70A and 70D. The patterned mask 74 covers portions of the first spacer layer 8A that are exposed during the forming of the spacers 82.

After forming the patterned mask 74, a patterning process is performed on the fins 56 to form recesses 76 and 78 in source/drain regions of the fins 56. In some embodiments, the patterning process may include a suitable anisotropic dry etching process, while using the patterned mask 74, the sacrificial gates 70, the patterned mask 72, the spacers 82, and/or isolation regions 54 as a combined mask. The suitable anisotropic dry etching process may include a reactive ion etch (RIE), a neutral beam etch (NBE), the like, or a combination thereof. In some embodiments, bottoms of the recesses 76 may be disposed below bottoms of the recesses 78. In some embodiments, a width of the recesses 76 is greater than a width of the recesses 78. In some embodiments, using the patterned mask 74 allows for reducing a width and a volume of the recesses 76, which improves growth properties of subsequently formed epitaxial source/drain regions. After forming the recesses 76 and 78, the patterned mask 74 is removed. In some embodiments where the patterned mask 74 comprises a photoresist material, the patterned mask 74 may be removed using an ashing process followed by a wet cleaning process. After the patterning process, each of the sacrificial gates 70 has a sidewall spacer structure comprising an unremoved portion of the first spacer layer 80A and a spacer 82. In some embodiments, the recesses 76 have a depth $D_8$ (measured form top surfaces of respective fins 56) between about 50 nm and about 70 nm. In some embodiments, the recesses 78 have a depth $D_9$ (measured form top surfaces of respective fins 56) between about 45 nm and about 65 nm. In some embodiments, the depth $D_8$ is greater than the depth $D_9$.

Figure 12A:
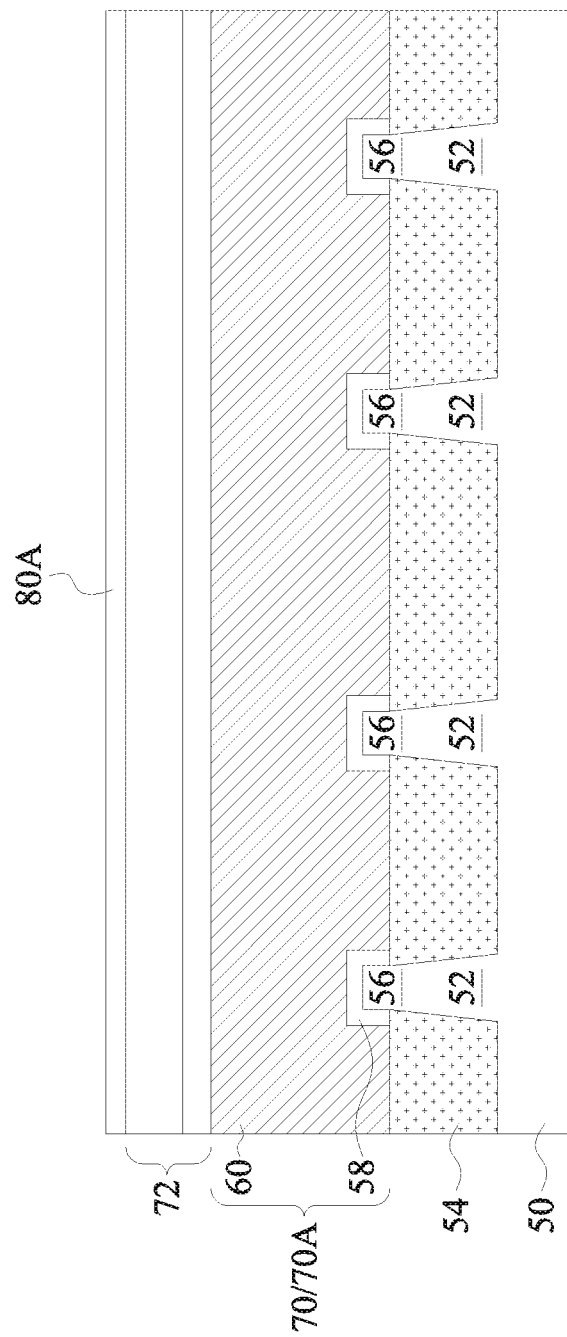
FIGS. 12A, 12B and 12C are cross-sectional views of intermediate stages in the manufacture of a FinFET device in accordance with some embodiments.
Figure 12B:
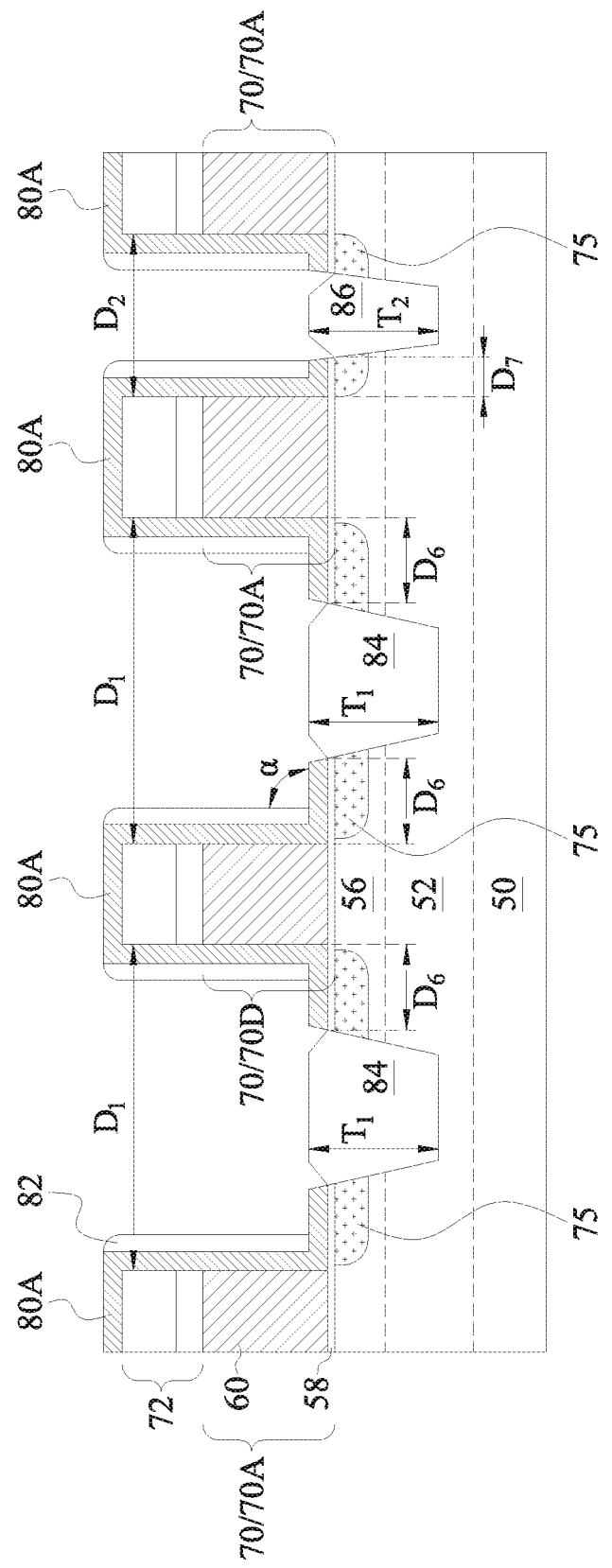
Figure 12C:
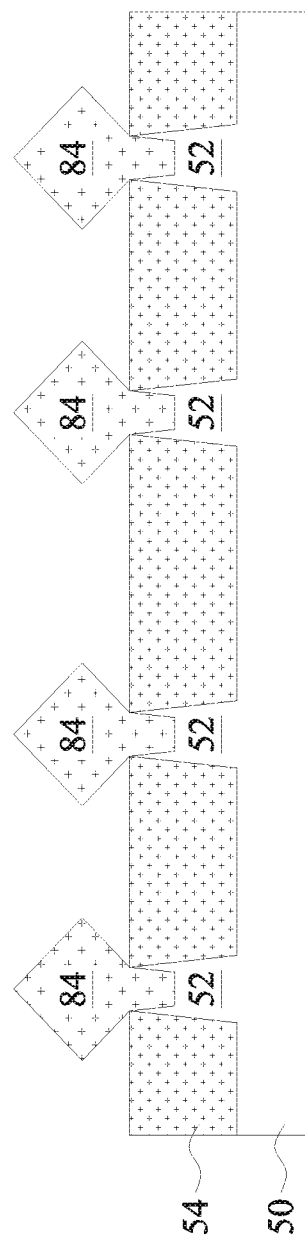

Referring to FIGS. 12A, 12B, and 12C, epitaxial source/drain regions 84 and 86 are formed in the recesses 76 and 78 (see FIGS. 11A, 11B, and 11C), respectively. In some embodiments, the epitaxial source/drain regions 84 and 86 are epitaxially grown in the recesses 76 and 78 using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments where the resulting FinFET device is an n-type device and the fins 56 are formed of silicon, the epitaxial source/drain regions 84 and 86 may include silicon, SiC, SiCP, SiP, or the like. In some embodiments where the resulting FinFET device is a p-type device and the fins 56 are formed of silicon, the epitaxial source/drain regions 84 and 86 may include SiGe, SiGeB, Ge, GeSn, or the like. The epitaxial source/drain regions 84 and 86 may have surfaces raised from respective surfaces of the fins 56 and may have facets. In some embodiments, the epitaxial source/drain regions 84 and 86 may extend past the fins 56 and into the semiconductor strips 52. In some embodiments, a width of the epitaxial source/drain regions 84 is greater than a width of the epitaxial source/drain regions 86. In some embodiments, the epitaxial source/drain regions 84 have a greater volume than the epitaxial source/drain regions 86. In some embodiments, the material of the epitaxial source/drain regions 84 and 86 may be implanted with suitable dopants. In some embodiments, the implantation process is similar to the process used for forming the LLD regions 75 as described above with reference to FIGS. 8A, 8B, and 8C, and the description is not repeated herein for the sake of brevity. In other embodiments, the material of the epitaxial source/drain regions 84 and 86 may be in situ doped during growth. In some embodiments, the epitaxial source/drain regions 84 may have a thickness $T_1$ between about 50 nm and about 70 nm. In some embodiments, the epitaxial source/drain regions 86 may have a thickness $T_2$ between about 50 nm and about 70 nm. In some embodiments, the thickness $T_1$ may be greater than the thickness $T_2$.

Figure 17A:
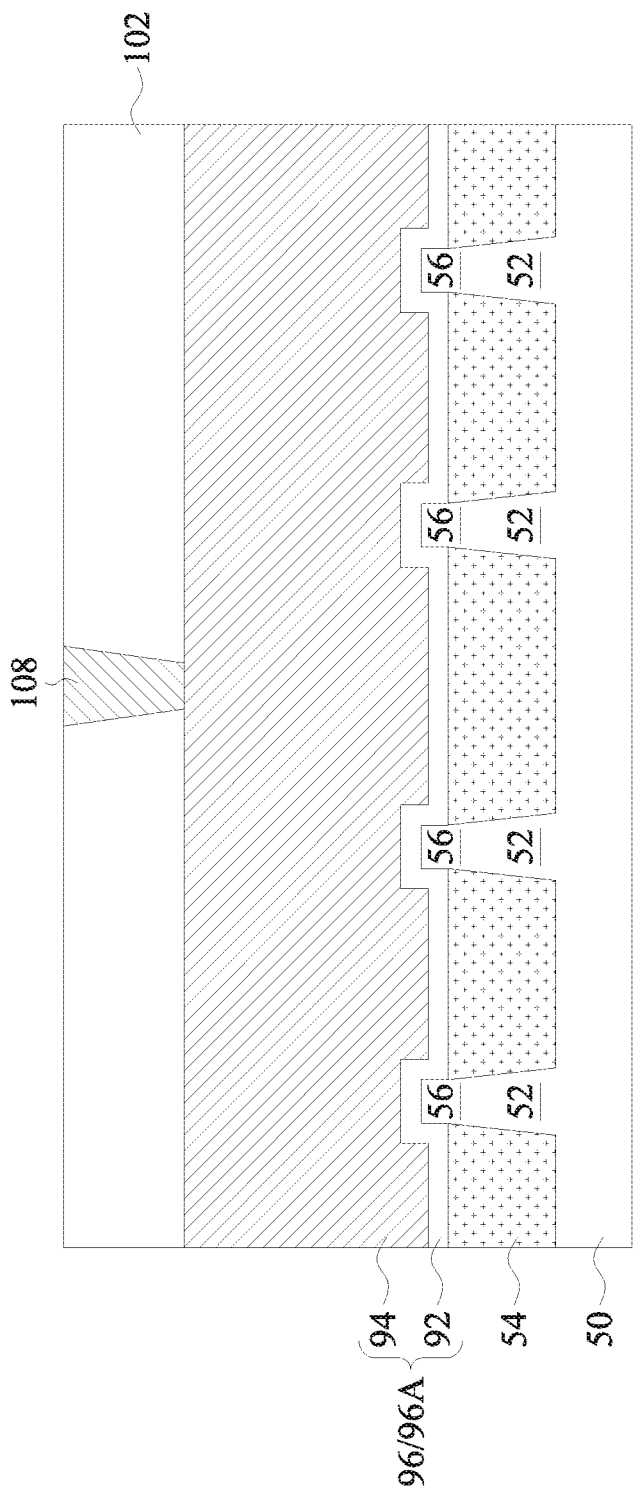
FIGS. 17A, 17B and 17C are cross-sectional views of a FinFET device in accordance with some embodiments.
Figure 17B:
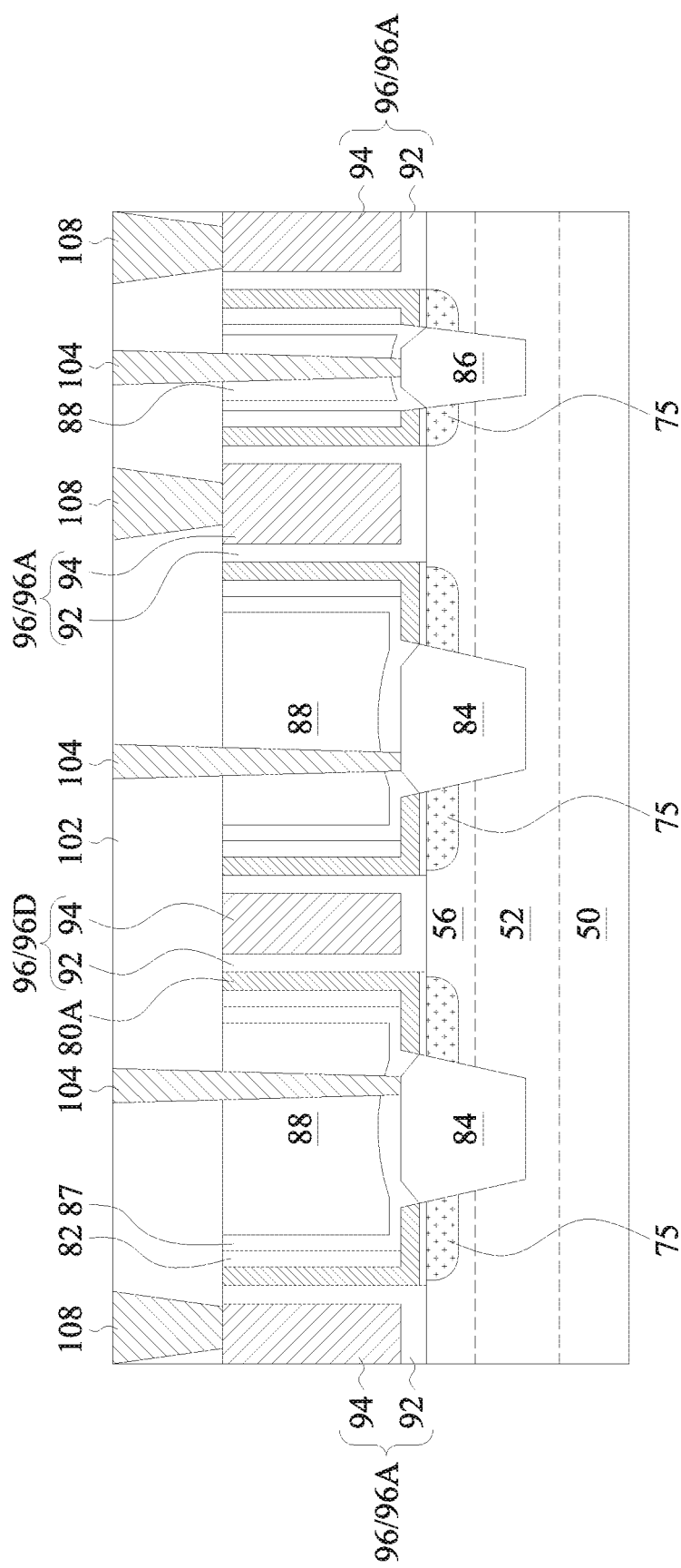
Figure 17C:
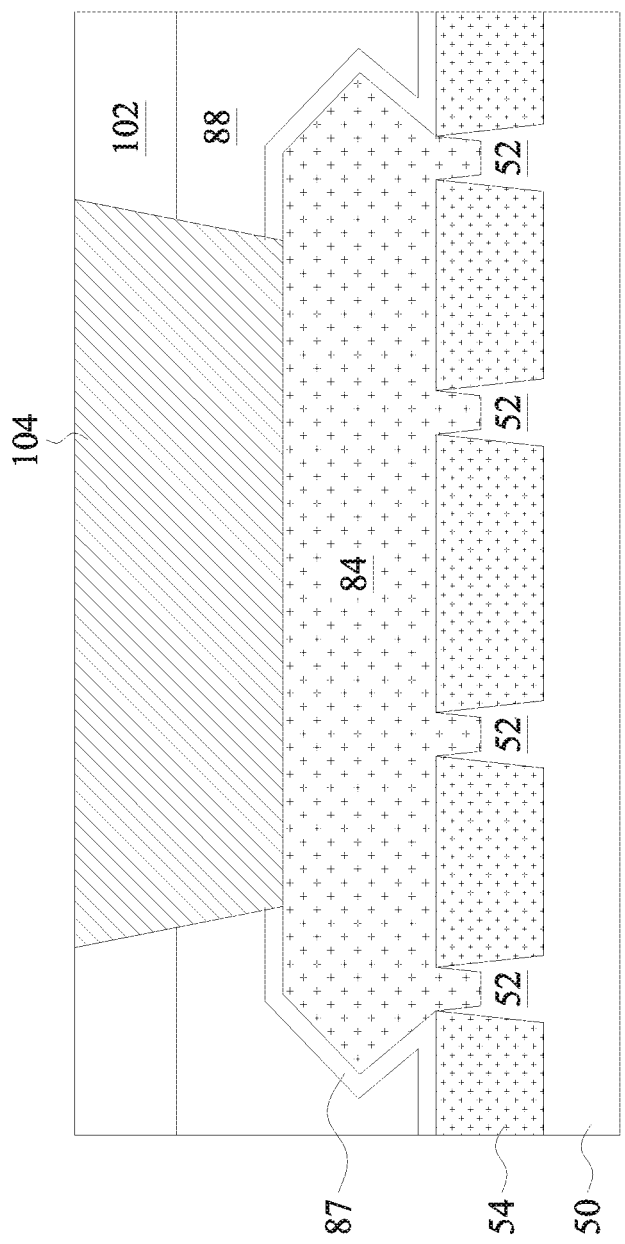

In the illustrated embodiments, each of the epitaxial source/drain regions 84 and each of the epitaxial source/drain regions 86 are physically separate from other epitaxial source/drain regions 84 and 86, respectively. In other embodiments, adjacent epitaxial source/drain regions 84 and adjacent epitaxial source/drain regions 86 may be merged. Such an embodiment is depicted in FIGS. 17A, 17B, and 17C, where adjacent epitaxial source/drain regions 84 are merged to form a common epitaxial source/drain region 84.

Referring further to FIGS. 12A, 12B, and 12C, each of the sacrificial gates 70D has a symmetric arrangement of the epitaxial source/drain regions, such that each of the sacrificial gates 70D is separated from adjacent epitaxial source/drain regions 84 by a same distance $D_6$ that is greater than a sum of a thickness of the first spacer layer 80A and a width of the spacers 82. In addition, each of the sacrificial gates 70A has an asymmetric arrangement of the epitaxial source/drain regions, such that each of the sacrificial gates 70A is separated from an adjacent epitaxial source/drain region 84 by the distance $D_6$, and from an adjacent epitaxial source/drain region 86 by the distance $D_7$ that equals to a sum of the thickness of the first spacer layer 80A and the width of the spacers 82. Furthermore, regions of the fins 56 interposed between the epitaxial source/drain regions 84 and adjacent sacrificial gates 70 are covered by the first spacer layer 80A. In some embodiments, the first spacer layer 80A prevents the epitaxial source/drain regions 84 from climbing up sidewalls of the spacers 82 and extending along the sidewalls of the spacers 82, which degrades the ESD protection capabilities of the resulting FinFET device. In some embodiments, by spacing apart the epitaxial source/drain regions 84 and adjacent sacrificial gates 70A, current punch through may be avoided in the resulting FinFET device. In some embodiments, the sidewalls of the spacers 82 and top surfaces of the first spacer layer 80A form an angle α. In some embodiments, the angle α is between about 90 degrees and about 120 degrees.

Figure 13A:
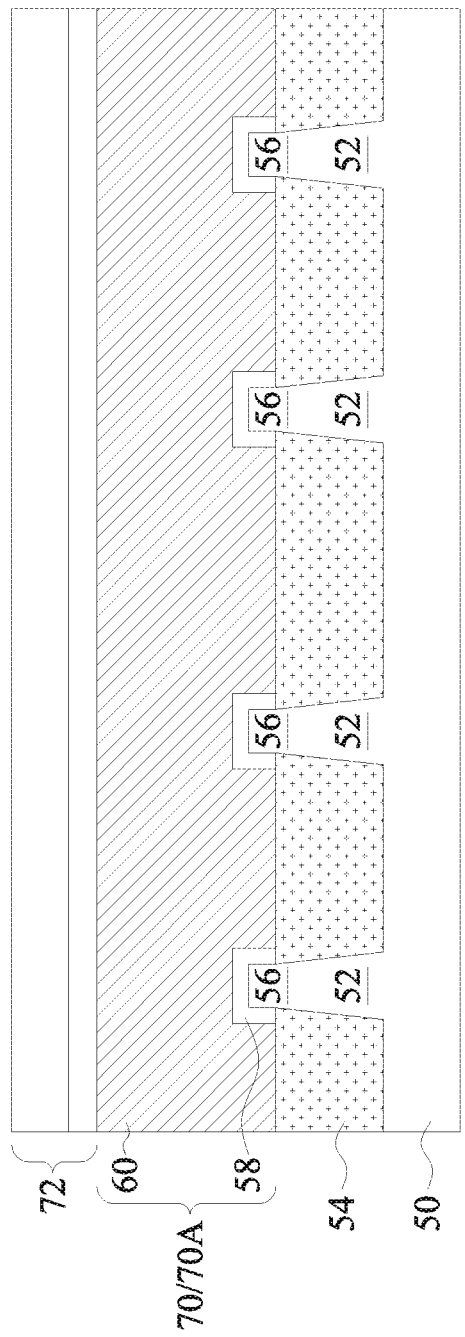
FIGS. 13A, 13B and 13C are cross-sectional views of intermediate stages in the manufacture of a FinFET device in accordance with some embodiments.
Figure 13B:
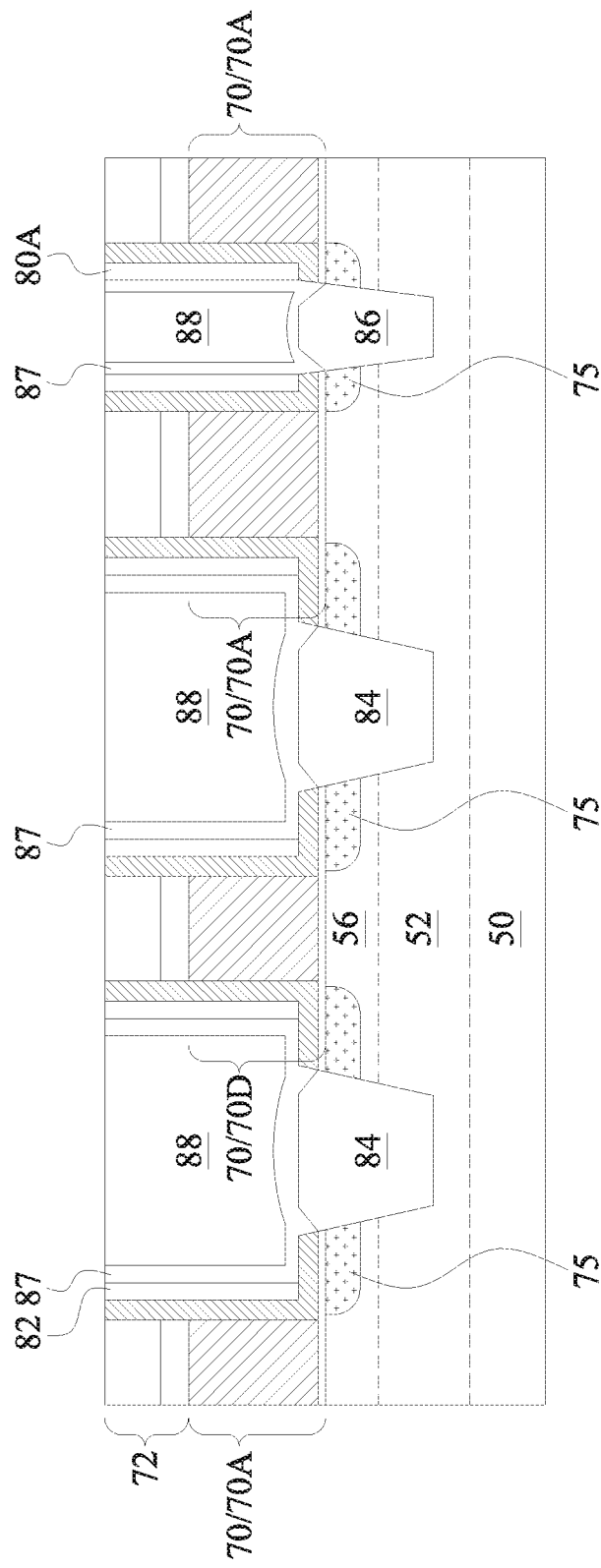
Figure 13C:
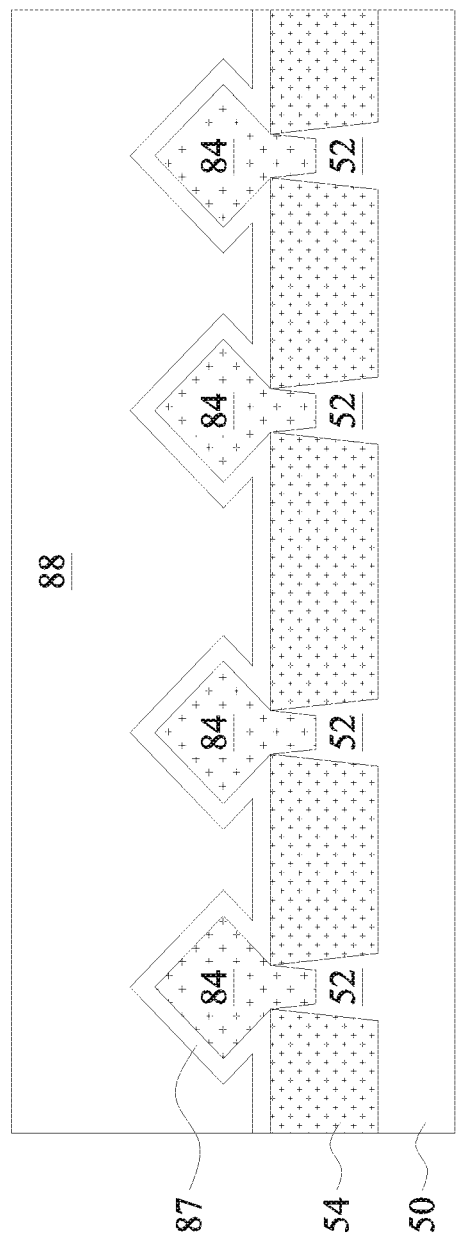

Referring to FIGS. 13A, 13B, and 13C, an etch stop layer 87 and an interlayer dielectric (ILD) 88 are deposited over the sacrificial gates 70, and over the epitaxial source/drain regions 84 and 86. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a spin-on-glass process, a combination thereof, or the like. In some embodiments, the etch stop layer 87 is used as a stop layer while patterning the ILD 88 to form openings for subsequently formed contacts. Accordingly, a material for the etch stop layer 87 may be chosen such that the material of the etch stop layer 87 has a lower etch rate than the material of ILD 88. In some embodiments, a planarization process, such as a CMP, may be performed to level the top surface of ILD 88 with the top surface of the patterned mask 72. After the planarization process, the top surface of the patterned mask 72 is exposed through the ILD 88. In other embodiments, the CMP may also remove a portion or an entirety of the patterned mask 72.

Figure 14A:
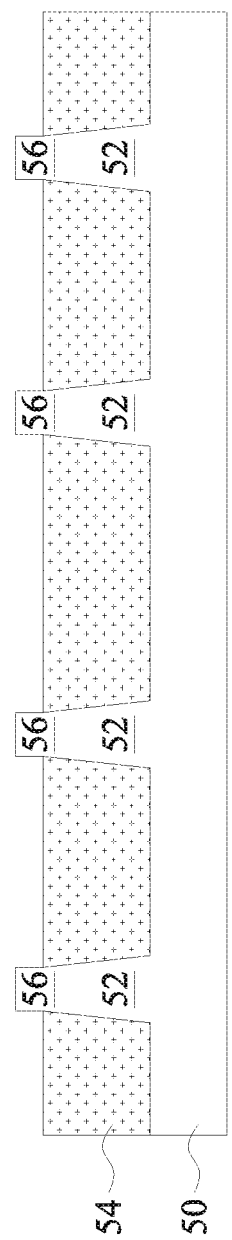
FIGS. 14A, 14B and 14C are cross-sectional views of intermediate stages in the manufacture of a FinFET device in accordance with some embodiments.
Figure 14B:
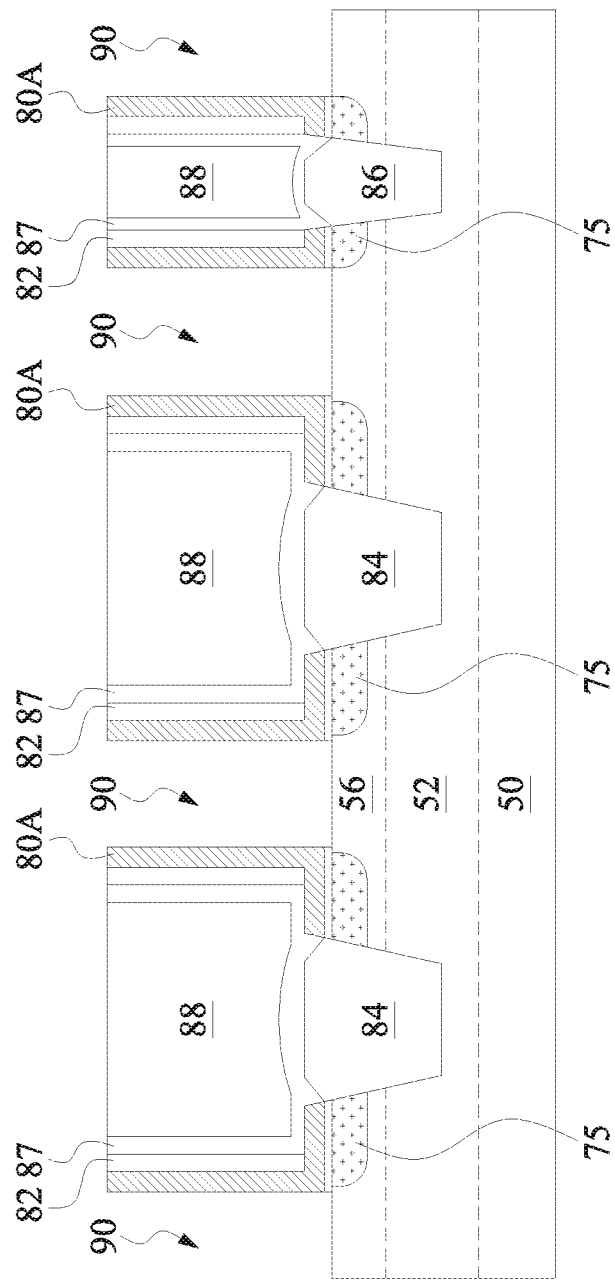
Figure 14C:
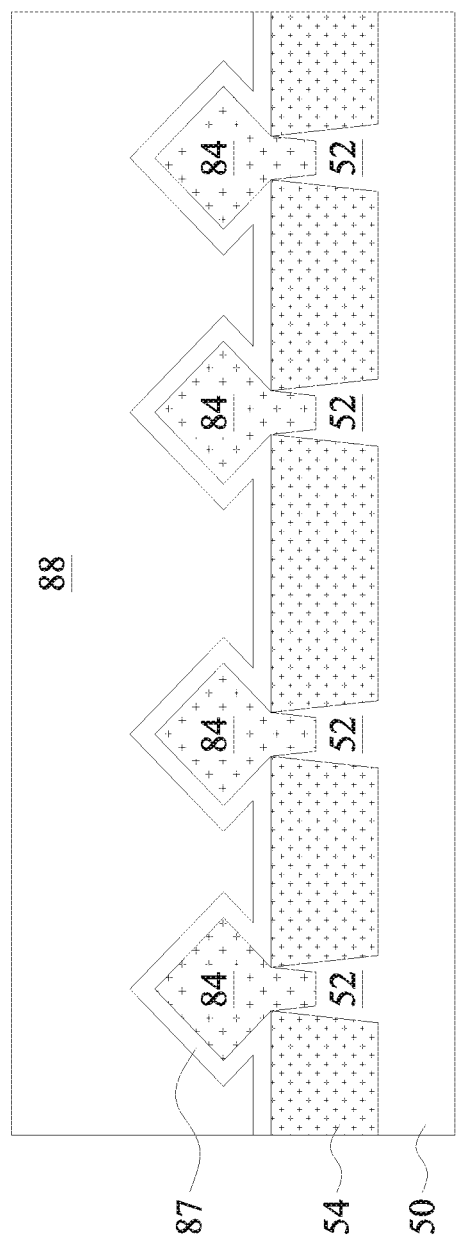

Referring to FIGS. 14A, 14B, and 14C, remaining portions of the patterned mask 72 and the sacrificial gates 70 are removed to form recesses 90 in the ILD 88. In some embodiments, the patterned mask 72 and the sacrificial gates 70 are removed using one or more etching steps. Each of the recesses 90 exposes a channel region of a respective fin 56. In some embodiments, the dielectric layer 58 may be used as an etch stop layer when the sacrificial gates 70 are etched. After removing the sacrificial gates 70, the dielectric layer 58 may be also removed.

Figure 15A:
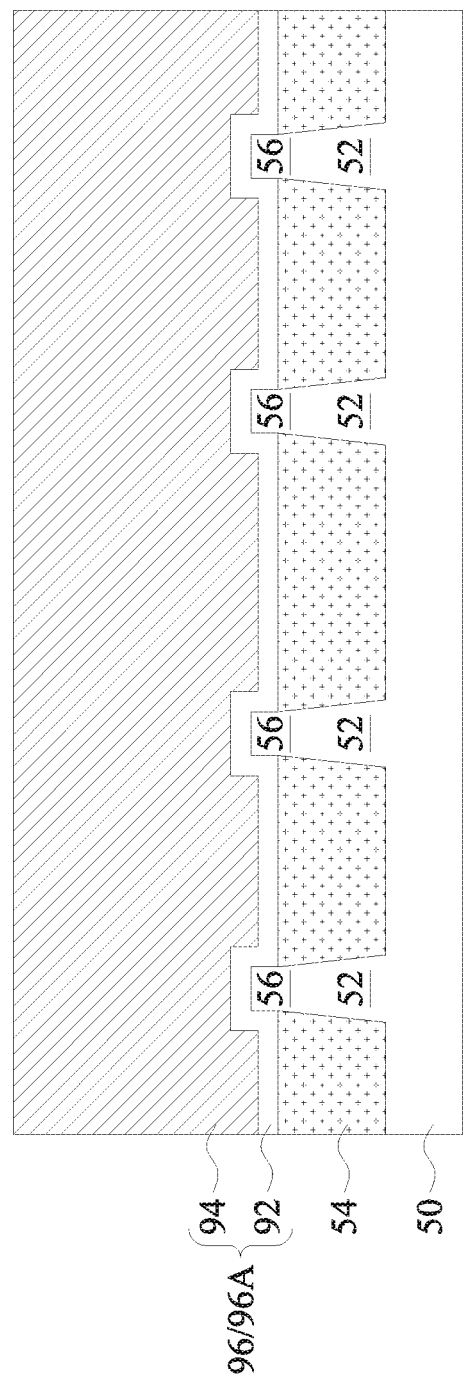
FIGS. 15A, 15B and 15C are cross-sectional views of intermediate stages in the manufacture of a FinFET device in accordance with some embodiments.
Figure 15B:
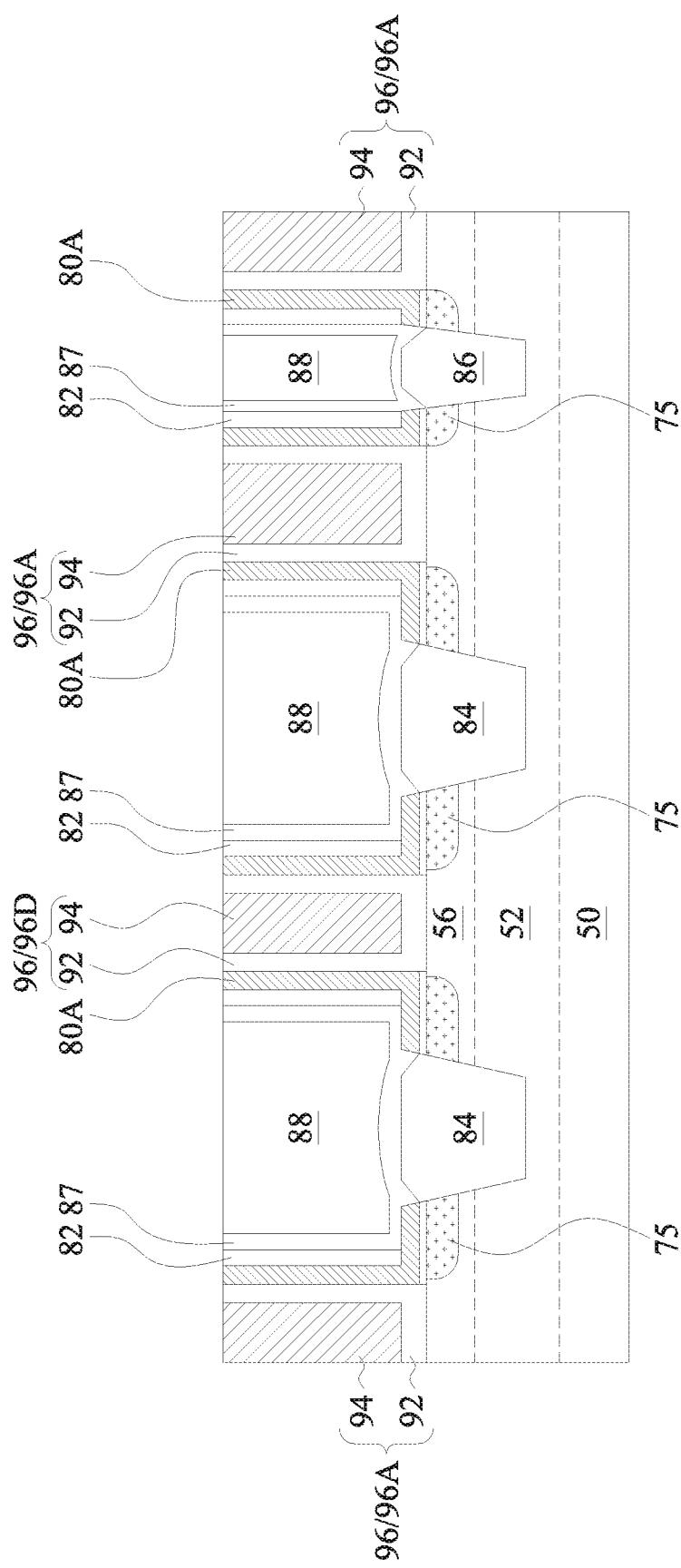
Figure 15C:
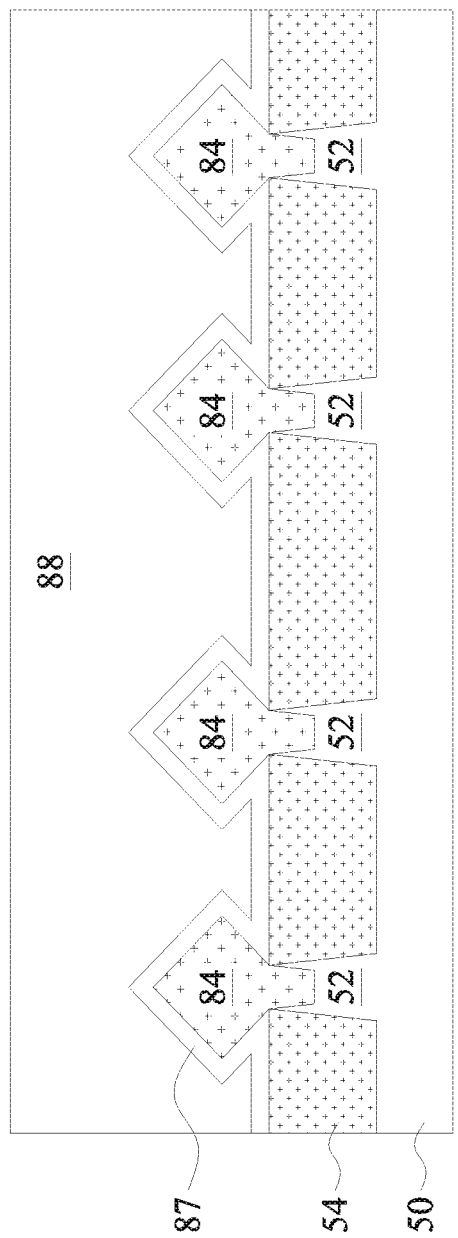

Referring to FIGS. 15A, 15B, and 15C, a gate dielectric layer 92 and a gate electrode layer 94 are formed in the recesses 90 (see FIGS. 14A, 14B, and 14C). The gate dielectric layer 92 is deposited conformally in the recesses 90. In some embodiments, the gate dielectric layer 92 comprises silicon oxide, silicon nitride, or multilayers thereof. In other embodiments, the gate dielectric layer 92 includes a high-k dielectric material, and in these embodiments, the gate dielectric layer 92 may have a k value greater than about 7.0, and may include a metal oxide or a silicate of Hf, Al, Zr, La, Mg, Ba, Ti, Pb, and combinations thereof. The formation methods of the gate dielectric layer 92 may include Molecular-Beam Deposition (MBD), ALD, PECVD, a combination thereof, or the like. In some embodiments, the gate dielectric layer 92 may have a thickness between about 3 nm and about 5 nm.

In some embodiments, an interfacial layer (not shown) may be formed over the channels region of the fins 56 prior to forming the gate dielectric layer 92, and the gate dielectric layer 92 is formed over the interfacial layer. The interfacial layer helps buffer the subsequently formed high-k dielectric layer from the underlying semiconductor material. In some embodiments, the interfacial layer is a chemical silicon oxide, which may be formed of chemical reactions. For example, a chemical oxide may be formed using deionized water+ozone ($O_3$), $NH_4OH+H_2O_2+H_2O$ (APM), or other methods. Other embodiments may utilize a different material or processes (e.g., a thermal oxidation or a deposition process) for the interfacial layer. In some embodiments, the interfacial layer may have a thickness between about 1 nm and about 3 nm.

Next, the gate electrode layer 94 is deposited over the gate dielectric layer 92 and fills the remaining portions of the recesses 90. The gate electrode layer 94 may be a metal selected from a group of W, Cu, Ti, Ag, Al, TiAl, TiAlN, TaC, TaCN, TaSiN, Mn, Co, Pd, Ni, Re, Ir, Ru, Pt, and Zr. In some embodiments, the gate electrode layer 94 comprises a metal selected from a group of TiN, WN, TaN, and Ru. Metal alloys such as Ti—Al, Ru—Ta, Ru—Zr, Pt—Ti, Co—Ni and Ni—Ta may be used and/or metal nitrides such as $WN_x$, $TiN_x$, $MoN_x$, $TaN_x$, and $TaSi_xN_y$ may be used. The gate electrode layer 94 may be formed using a suitable process such as ALD, CVD, PVD, plating, or combinations thereof. In some embodiments, the gate electrode layer 94 may have a thickness between about 100 nm and about 170 nm. After the filling of the recesses with the gate electrode layer 94, a planarization process, such as a CMP, may be performed to remove the excess portions of the gate dielectric layer 92 and the gate electrode layer 94, which excess portions are over the top surface of ILD 88. The resulting remaining portions of materials of the gate electrode layer 94 and the gate dielectric layer 92 thus form replacement gates 96 of the resulting FinFET device. The replacement gates 96 that are disposed between adjacent epitaxial source/drain regions 84 are dummy replacement gates 96D, and the replacement gates 96 that are disposed between epitaxial source/drain regions 84 and 86 are active replacement gates 96A. As described below in greater detail, since the replacement gates 96D are dummy gates, contacts may not be formed to make an electrically contact to the dummy replacement gates 96D.

In some embodiments, one or more work function layers (not shown) may be formed over the gate dielectric layer 92 prior to forming the gate electrode layer 94, and the gate electrode layer 94 is formed over the one or more work function layers. In some embodiments, the one or more work function layers may comprise TaN, TiN, a combination thereof, or the like, and may be formed using ALD, CVD, a combination thereof, or the like. In some embodiments, the sacrificial gates 70 may remain rather than being replaced by the replacement gates 96.

Figure 16A:
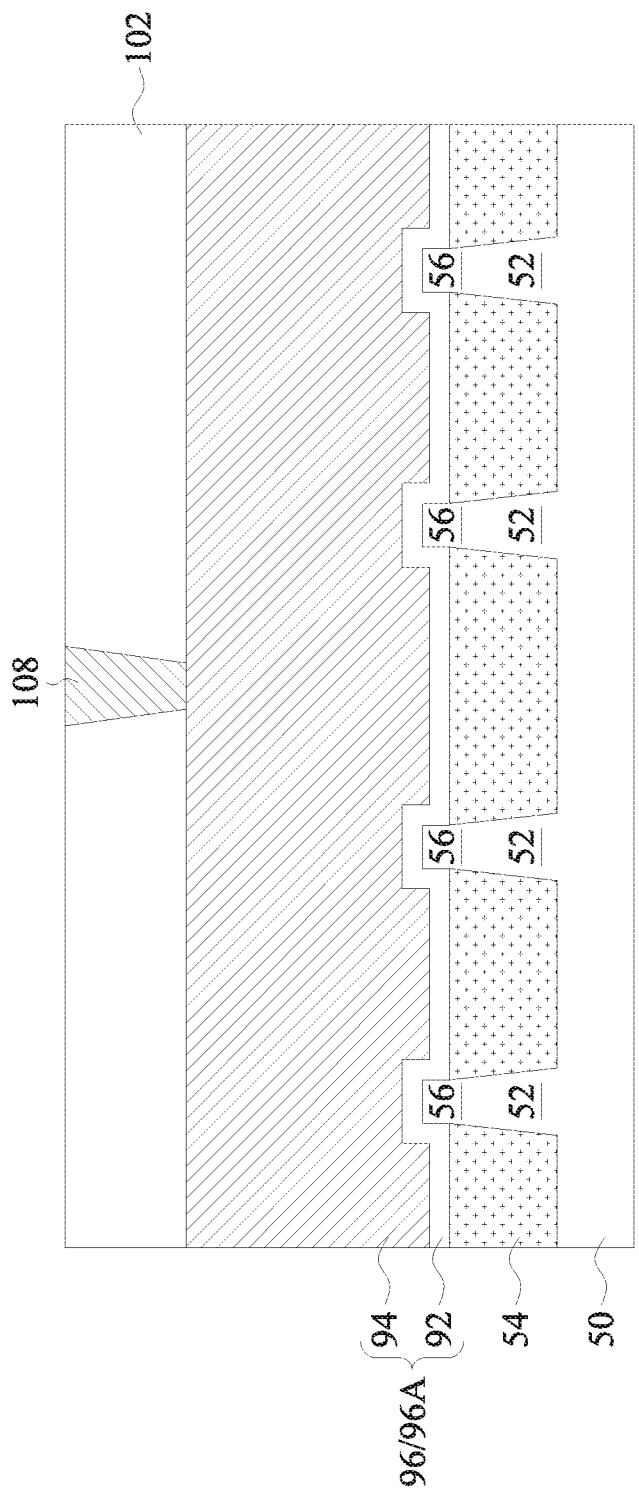
FIGS. 16A, 16B and 16C are cross-sectional views of intermediate stages in the manufacture of a FinFET device in accordance with some embodiments.
Figure 16B:
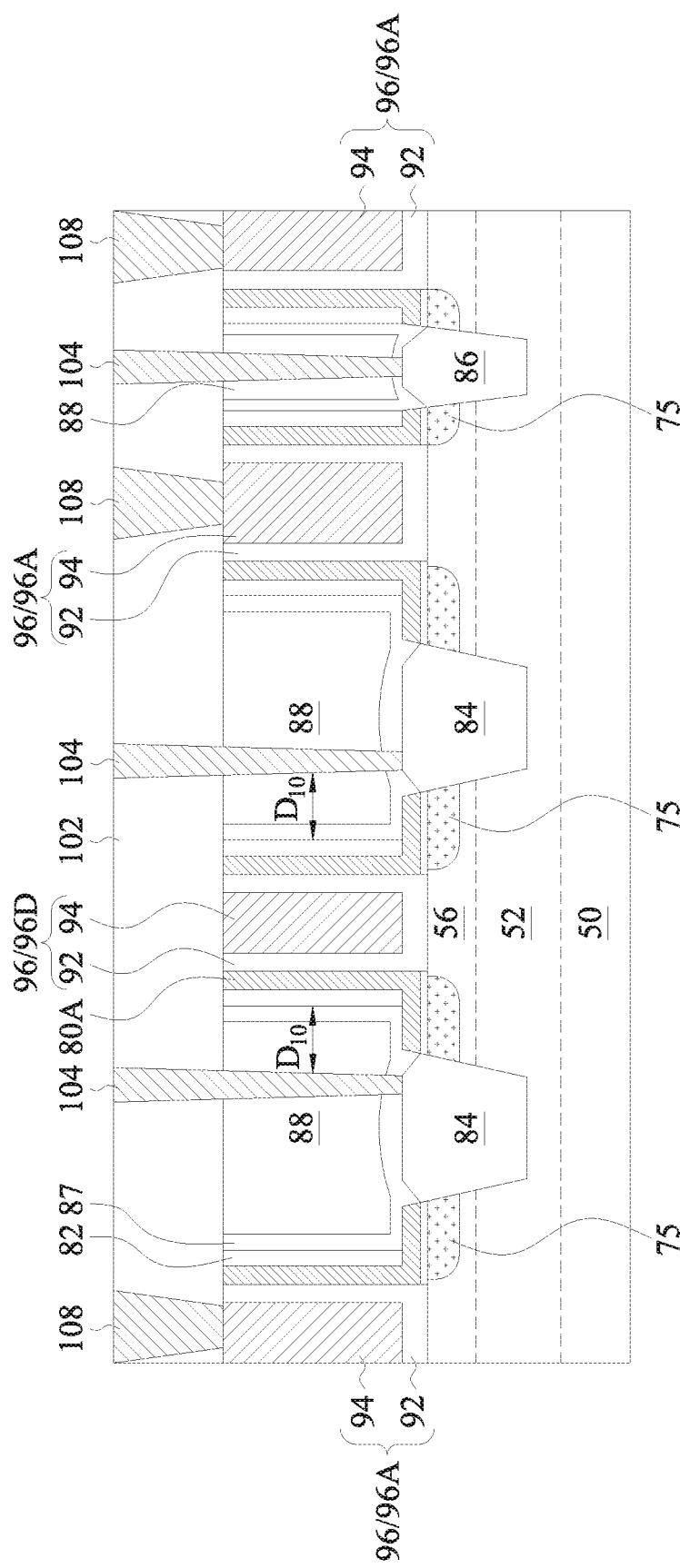
Figure 16C:
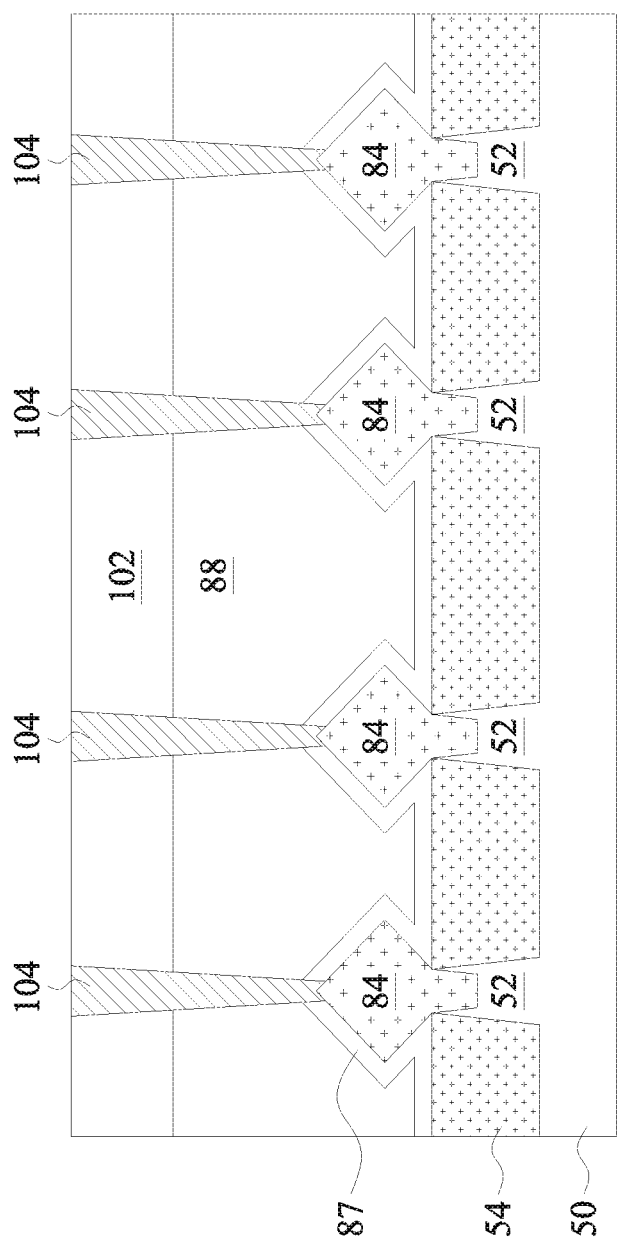

Referring to FIGS. 16A, 16B, and 16C, an ILD 102 is deposited over the ILD 88, contacts 104 are formed through the ILD 102 and the ILD 88, and contacts 108 are formed through the ILD 102. In an embodiment, the ILD 102 is formed using similar materials and methods as the ILD 88 described above with reference to FIGS. 14A, 14B, and 14C, and the description is not repeated herein for the sake of brevity. In some embodiments, the ILD 102 and the ILD 88 are formed of a same material. In other embodiments, the ILD 102 and the ILD 88 are formed of different materials.

Openings for the contacts 104 are formed through the ILDs 88 and 102, and the etch stop layer 87. Openings for the contacts 108 are formed through the ILD 102 and the etch stop layer 87. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess materials from a top surface of the ILD 102. The remaining liner and conductive material form contacts 104 and 108. An anneal process may be performed to form a silicide (not shown) at the interface between the epitaxial source/drain regions 84 and 86 and the contacts 104, respectively. The contacts 104 are physically and electrically coupled to the epitaxial source/drain regions 84 and 86, and the contacts 108 are physically and electrically coupled to the replacement gates 96. In some embodiments, contacts are not formed to be physically and electrically coupled to the dummy replacement gates 96D. While the contacts 104 are depicted in FIG. 16B in a same cross-section as the contacts 108, this depiction is for the purposes of illustration only and, in some embodiments, the contacts 104 may be disposed in a different cross-section from the contacts 108. In some embodiments, the contacts 104 are spaced apart from nearest spacers 82 of dummy replacement gates 96D by a distance $D_{10}$. In some embodiments, the distance $D_{10}$ is between about 10 nm and about 25 nm.

FIGS. 17A, 17B, and 17C illustrate cross-sectional views of a FinFET device that is similar to the FinFET device illustrated in FIGS. 16A, 16B, and 16C, with like elements labeled with like numerical references. In some embodiments, the FinFET device of FIGS. 17A, 17B, and 17C may be formed using similar materials and methods and FinFET device of FIGS. 16A, 16B, and 16C described above with reference to FIGS. 3A-16C, and the description is not repeated herein for the sake of brevity. In the illustrated embodiment, adjacent epitaxial source/drain regions 84 are merged to form a common epitaxial source/drain region 84.

In some embodiments, voids (not shown) may be formed below the common epitaxial source/drain region 84, between the common epitaxial source/drain region 84 and the isolation regions 54. In some embodiments, the voids are filled with the material of the ILD 88. In the illustrated embodiment, the common epitaxial source/drain region 84 has a planar top surface. In other embodiments, the common epitaxial source/drain region 84 may have a non-planar top surface.

Figure 18:
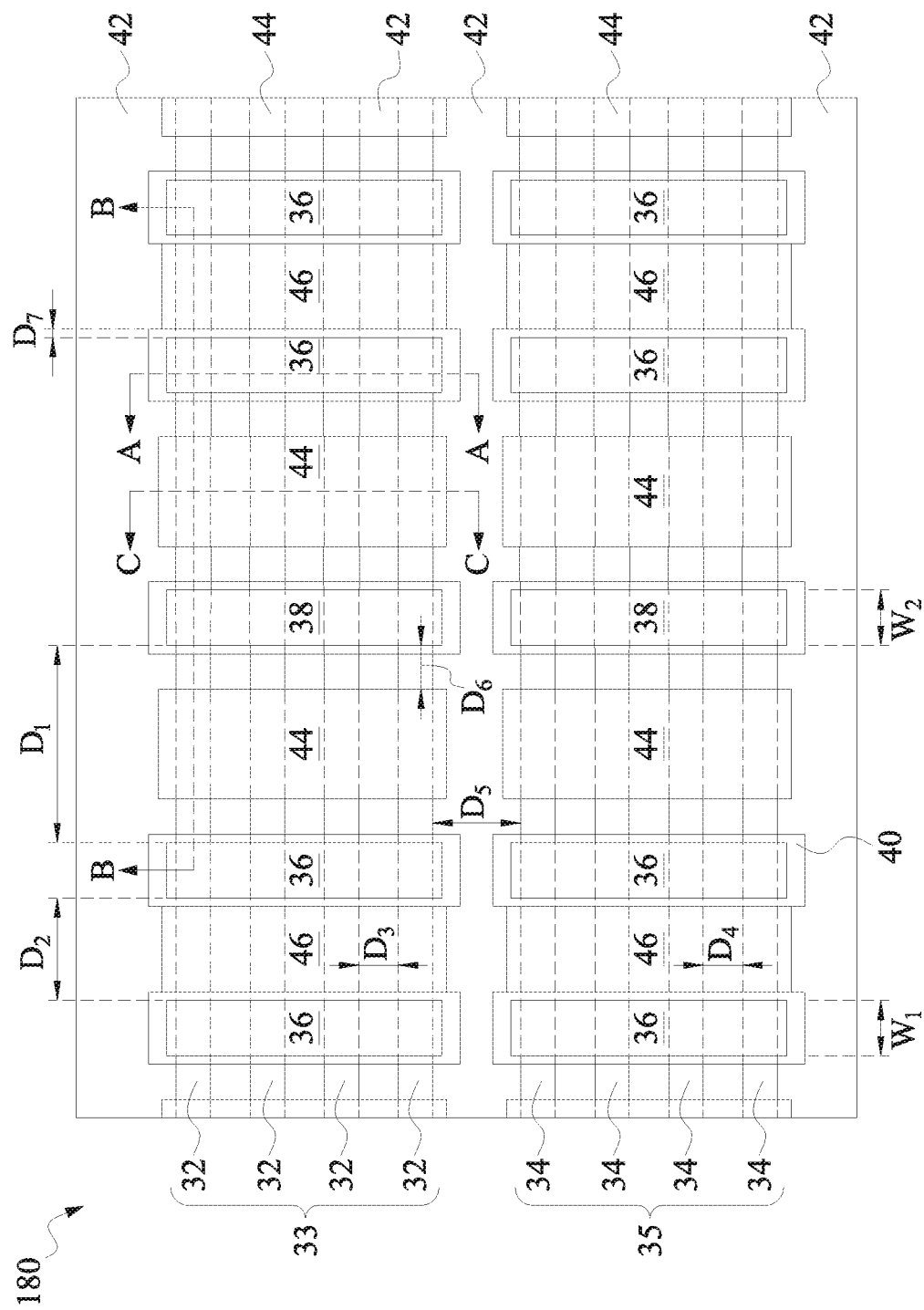
FIG. 18 is a top view of a FinFET device in accordance with some embodiments.

FIG. 18 is a top view of a FinFET device 180 in accordance with some embodiments. The FinFET device 180 is similar to the FinFET device 30 illustrated in FIG. 2, with like elements labeled with like numerical references. In the illustrated embodiments, adjacent epitaxial source/drain regions 44 are merged to form common epitaxial source/drain regions 44 for the fin groups 33 and 35, and adjacent epitaxial source/drain regions 46 are merged to form common epitaxial source/drain regions 46 for fin groups 33 and 35.

Figure 19:
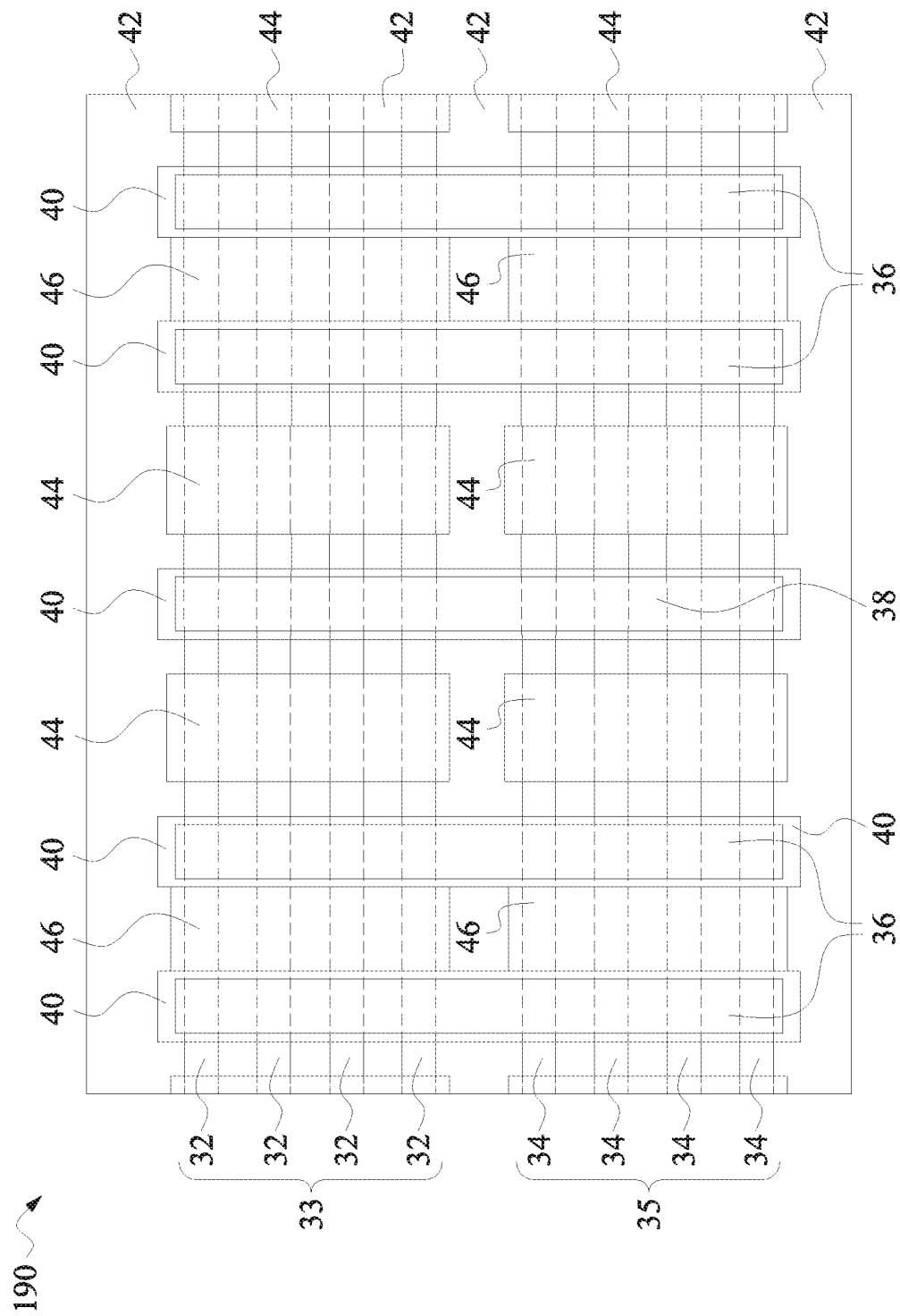
FIG. 19 is a top view of a FinFET device in accordance with some embodiments.

FIG. 19 is a top view of a FinFET device 190 in accordance with some embodiments. The FinFET device 190 is similar to the FinFET device 30 illustrated in FIG. 2, with like elements labeled with like numerical references. In the illustrated embodiments, the FinFET device 190 comprises the active gates 36 and the dummy gates 38 that extend over both the fin group 33 and the fin group 35.

Figure 20:
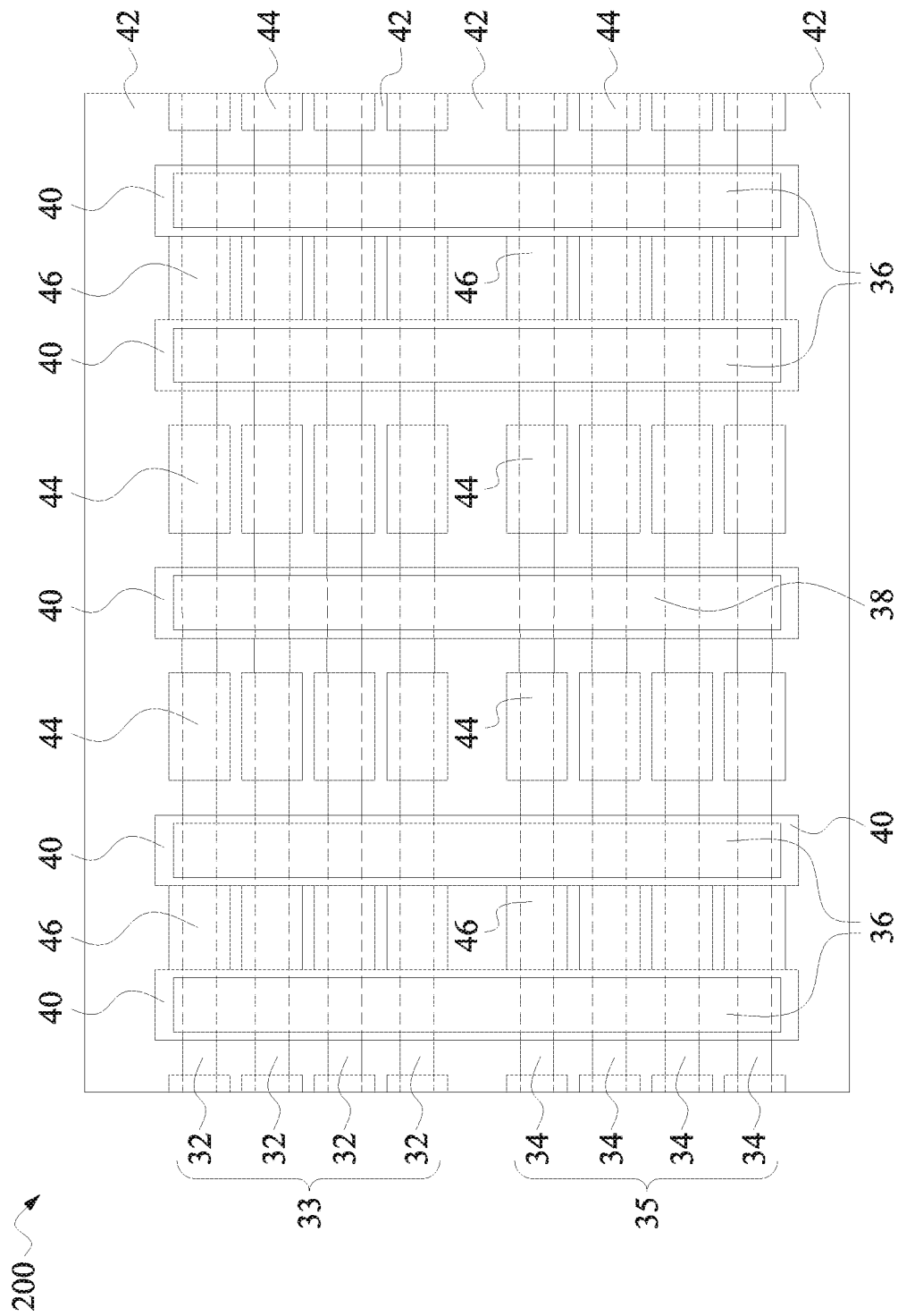
FIG. 20 is a top view of a FinFET device in accordance with some embodiments.

FIG. 20 is a top view of a FinFET device 200 in accordance with some embodiments. The FinFET device 200 is similar to the FinFET device 30 illustrated in FIG. 2, with like elements labeled with like numerical references. In the illustrated embodiments, the FinFET device 200 comprises the active gates 36 and the dummy gates 38 that extend over both the fin group 33 and the fin group 35. Furthermore, the FinFET device 200 comprises individual epitaxial source/drain regions 44 and 46 for each of the fins 32 and each of the fins 34.

Figure 21:
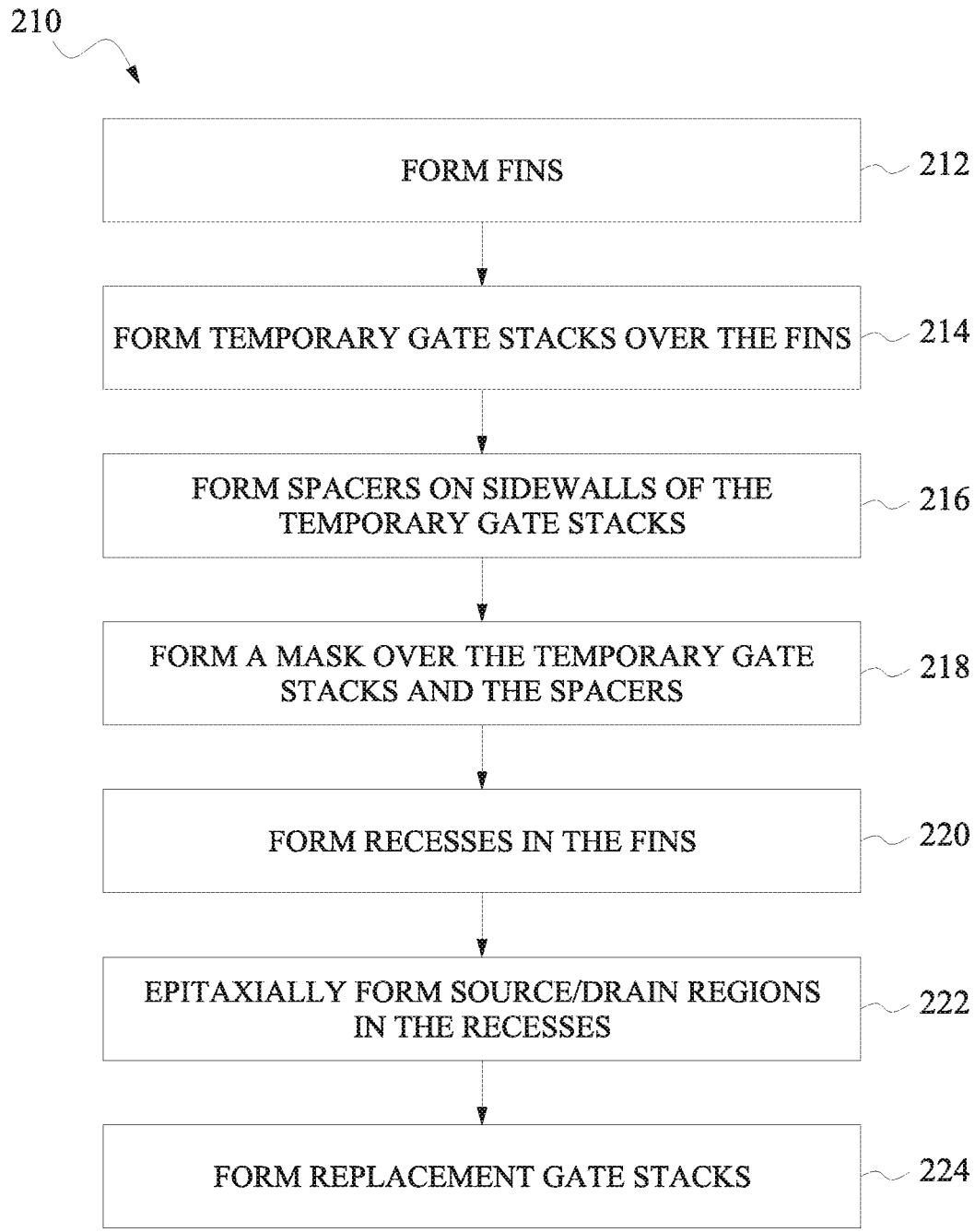
FIG. 21 is a flow diagram illustrating a method of forming a FinFET device in accordance with some embodiments.

FIG. 21 is a flow diagram illustrating a method 210 of forming a FinFET device in accordance with some embodiments. The method 210 starts with step 212, where a substrate (such as the substrate 50 illustrated in FIG. 3A) is patterned to form fins (such as the fins 56 illustrated in FIG. 6A) as described above with reference to FIGS. 3A-6A. In step 214, sacrificial gate stacks (such as the sacrificial gates 70 illustrated in FIGS. 8A and 8B) are formed over the fins as described above with reference to FIGS. 7A, 7B, and 8A-8C. In step 216, spacers (such as the spacers 82 illustrated in FIG. 10B) are formed on sidewalls of the sacrificial gate stacks as described above with reference to FIGS. 9A-10C. In step 218, a mask (such as the patterned mask 74 illustrated in FIGS. 11A and 11B) is formed over the sacrificial gate stacks and the spacers as described above with reference to FIGS. 11A-11C. In step 220, the fins are patterned using the sacrificial gate stacks, the spacers and the mask as a combined mask to form recesses (such as the recesses 76 and 78 illustrated in FIGS. 11B and 11C) in the fins as described above with reference to FIGS. 11A-11C. In step 222, source/drain regions (such as the epitaxial source/drain regions 84 and 86 illustrated in FIGS. 12B and 12C) are epitaxially grown in the recesses as described above with reference to FIGS. 12A-12C. In step 224, replacement gate stacks (such as the replacement gates 96 illustrated in FIGS. 15A and 15B) are formed over the fins as described above with reference to FIGS. 13A-15C.

Various embodiments discussed herein allow for forming a FinFET device, which may function as an ESD protection device. Various embodiments further allow for improving ESD protection proprieties, avoiding current punch through, improving growth properties of epitaxial source/drain regions, and preventing the epitaxial source/drain regions from climbing up along sidewalls of gate spacers during the epitaxial growth.

According to an embodiment, a method includes: forming a fin extending above an isolation region; forming a sacrificial gate stack over the fin, the sacrificial gate stack having a first sidewall and a second sidewall opposite the first sidewall; forming a first spacer on the first sidewall of the sacrificial gate stack; forming a second spacer on the second sidewall of the sacrificial gate stack; forming a patterned mask layer having an opening therein over the sacrificial gate stack, the first spacer and the second spacer, the patterned mask layer extending along a top surface and a sidewall of the first spacer, the second spacer being exposed through the opening in the patterned mask layer; patterning the fin using the patterned mask layer, the sacrificial gate stack, the first spacer and the second spacer as a combined mask to form a recess in the fin; and epitaxially growing a source/drain region in the recess. In an embodiment, forming the first spacer and forming the second spacer includes: forming a first spacer layer over a top surface and along the first sidewall and the second sidewall of the sacrificial gate stack; forming a second spacer layer over the first spacer layer; and removing lateral portions of the second spacer layer, remaining portions of the second spacer layer forming the first spacer and the second spacer. In an embodiment, the first spacer layer and the second spacer layer comprise different materials. In an embodiment, the method further includes replacing the sacrificial gate stack with a replacement gate stack. In an embodiment, the replacement gate stack is an active gate stack. In an embodiment, the replacement gate stack is a dummy gate stack. In an embodiment, the source/drain region and the fin comprise different semiconductor materials.

According to another embodiment, a method includes: patterning a substrate to form trenches, the substrate comprising a first semiconductor material; filling trenches with a dielectric material to form isolation regions; etching the isolation regions to expose fins; forming a sacrificial gate stack along sidewalls and over top surfaces of the fins; depositing a first spacer layer along a sidewall and over a top surface of the sacrificial gate stack and over the top surfaces of the fins; depositing a second spacer layer over the first spacer layer; etching the second spacer layer to remove lateral portions of the second spacer layer, remaining portions of the second spacer layer forming gate spacers; forming a patterned mask over the sacrificial gate stack and the gate spacers, the patterned mask extending over at least a portion of the first spacer layer disposed over the top surfaces of the fins not being protected by at least one of the gate spacers; etching the first spacer layer and the fins using the patterned mask, the sacrificial gate stack, and the gate spacers as a combined mask to form first recesses in the fins; and filling the first recesses with a second semiconductor material to form source/drain regions in the first recesses. In an embodiment, the first spacer layer and the second spacer layer comprise different materials. In an embodiment, the first semiconductor material is different from the second semiconductor material. In an embodiment, the method further includes: forming a dielectric layer over the source/drain regions and along the sidewalls of the sacrificial gate stack; removing the sacrificial gate stack form a second recess in the dielectric layer; and forming a replacement gate stack in the second recess. In an embodiment, the replacement gate stack is an active gate stack. In an embodiment, the replacement gate stack is a dummy gate stack. In an embodiment, the method further includes merging the source/drain regions to form a common source/drain region for the fins.

According to yet another embodiment, a device includes: a fin over a substrate; a gate stack along sidewalls and over a top surface of a channel region of the fin, the gate stack having a first sidewall and a second sidewall opposite the second sidewall; a first gate spacer structure along the first sidewall of the gate stack, the first gate spacer structure comprising a first gate spacer, a first portion of the first gate spacer extending along the first sidewall of the gate stack, a second portion of the first gate spacer extending laterally away from the first sidewall of the gate stack and over the top surface of the fin; a second gate spacer structure along the second sidewall of the gate stack, the second gate spacer structure comprising a second gate spacer, a first portion of the second gate spacer extending along the second sidewall of the gate stack, a second portion of the second gate spacer extending laterally away from the second sidewall of the gate stack and over the top surface of the fin, a width of the second portion of the second gate spacer being less than a width of the second portion of the first gate spacer; a first epitaxial region adjacent the first gate spacer structure; and a second epitaxial region adjacent the second gate spacer structure. In an embodiment, the first gate spacer structure further comprises a third gate spacer extending along a sidewall of the first portion of the first gate spacer. In an embodiment, the second gate spacer structure further comprises a fourth gate spacer extending along a sidewall of the first portion of the second gate spacer, a width of the fourth gate spacer being substantially equal to a width of the third gate spacer. In an embodiment, a volume of the first epitaxial region is greater than a volume of the second epitaxial region. In an embodiment, a width of the first epitaxial region is greater than a width of the second epitaxial region. In an embodiment, a thickness of the first epitaxial region is greater than a thickness of the second epitaxial region.

According to yet another embodiment, a device includes: a gate stack on sidewalls and over a top surface of a semiconductor fin, the gate stack having a first sidewall and a second sidewall opposite to the second sidewall; a first spacer structure along the first sidewall of the gate stack, the first spacer structure including: a first spacer, a first portion of the first spacer extending along the first sidewall of the gate stack, a second portion of the first spacer extending laterally away from the first sidewall of the gate stack and over the top surface of the semiconductor fin; and a second spacer over the first spacer, the second spacer partially covering a top surface of the second portion of the first spacer; and a second spacer structure along the second sidewall of the gate stack, the second spacer structure including: a third spacer, a first portion of the third spacer extending along the second sidewall of the gate stack, a second portion of the third spacer extending laterally away from the second sidewall of the gate stack and over the top surface of the semiconductor fin; and a fourth spacer over the third spacer, the fourth spacer fully covering a top surface of the second portion of the third spacer.

According to yet another embodiment, a device includes: a gate stack on sidewalls and over a top surface of a semiconductor fin, the gate stack having a first sidewall and a second sidewall opposite to the second sidewall; a first spacer structure on the first sidewall of the gate stack, the first spacer structure including: a first spacer on the first sidewall of the gate stack; and a second spacer adjacent the first spacer, a first portion of the first spacer extending laterally away from the first sidewall of the gate stack and beyond a sidewall of the second spacer, the sidewall of the second spacer facing away from the gate stack; and a second spacer structure on the second sidewall of the gate stack, the second spacer structure including: a third spacer on the second sidewall of the gate stack; and a fourth spacer adjacent the third spacer, a first portion of the third spacer extending laterally away from the second sidewall of the gate stack to a sidewall of the fourth spacer, the sidewall of the fourth spacer facing away from the gate stack.

According to yet another embodiment, a device includes: a gate stack over an active region of a substrate, the gate stack having a first sidewall and a second sidewall opposite to the first sidewall; a first spacer structure along the first sidewall of the gate stack, the first spacer structure including: a first L-shaped spacer along the first sidewall of the gate stack, a lateral portion of the first L-shaped spacer having a first width; and a second spacer over the lateral portion of the first L-shaped spacer, the second spacer partially covering a top surface of the lateral portion of the first L-shaped spacer; and a second spacer structure along the second sidewall of the gate stack, the second spacer structure including: a third L-shaped spacer along the second sidewall of the gate stack, a lateral portion of the third L-shaped spacer having a second width less than the first width; and a fourth spacer over the lateral portion of the third L-shaped spacer, the fourth spacer fully covering a top surface of the lateral portion of the third L-shaped spacer.

According to yet another embodiment, a device includes: a gate stack over an active region of a substrate, the gate stack having a first sidewall and a second sidewall opposite to the first sidewall; a first spacer structure on the first sidewall of the gate stack, the first spacer structure including: a first L-shaped spacer in physical contact with the first sidewall of the gate stack, a lateral portion of the first L-shaped spacer extending away from the first sidewall of the gate stack to a first distance; and a second spacer adjacent the first L-shaped spacer, the second spacer having a first width, the first L-shaped spacer extending along a sidewall and a bottom surface of the second spacer; and a second spacer structure on the second sidewall of the gate stack, the second spacer structure including: a third L-shaped spacer in physical contact with the second sidewall of the gate stack, a lateral portion of the third L-shaped spacer extending away from the second sidewall of the gate stack to a second distance less than the first distance; and a fourth spacer adjacent the third L-shaped spacer, the fourth spacer having the first width, the third L-shaped spacer extending along a sidewall and a bottom surface of the fourth spacer.

According to yet another embodiment, a device includes: a gate stack over an active region of a substrate, the gate stack having a first sidewall and a second sidewall opposite to the first sidewall; a first gate spacer structure along the first sidewall of the gate stack, the first gate spacer structure including a first L-shaped gate spacer, a lateral portion of the first L-shaped gate spacer having a first width; a second gate spacer structure along the second sidewall of the gate stack, the second gate spacer structure including a second L-shaped gate spacer, a lateral portion of the second L-shaped gate spacer having a second width less than the first width; a first epitaxial region adjacent the first gate spacer structure, the first epitaxial region having a third width; and a second epitaxial region adjacent the second gate spacer structure, the second epitaxial region having a fourth width less than the third width.

According to yet another embodiment, a device includes: a gate stack over an active region of a substrate; a first spacer structure on a first sidewall of the gate stack, the first spacer structure including: a first spacer on the first sidewall of the gate stack, the first spacer including a first portion extending along the first sidewall of the gate stack and a second portion extending along a top surface of the active region away from the first sidewall of the gate stack; and a second spacer adjacent the first spacer, the second spacer partially covering a top surface of the second portion of the first spacer; and a first epitaxial source/drain region in the active region adjacent the first spacer structure, the first epitaxial source/drain region being laterally spaced apart from the second spacer.

According to yet another embodiment, a device includes: a gate stack over an active region of a substrate, the gate stack having a first sidewall and a second sidewall opposite to the first sidewall; a first epitaxial source/drain region in the active region adjacent the first sidewall of the gate stack, the first epitaxial source/drain region being laterally spaced apart from the first sidewall of the gate stack by a first distance; and a second epitaxial source/drain region in the active region adjacent the second sidewall of the gate stack, the second epitaxial source/drain region being laterally spaced apart from the second sidewall of the gate stack by a second distance different from the first distance.

According to yet another embodiment, a device includes: a gate stack over an active region of a substrate, the gate stack having a first sidewall and a second sidewall opposite to the first sidewall; a first epitaxial source/drain region in the active region adjacent the first sidewall of the gate stack, the first epitaxial source/drain region having a first width; and a second epitaxial source/drain region in the active region adjacent the second sidewall of the gate stack, the second epitaxial source/drain region having a second width different from the first width.

According to yet another embodiment, a device includes: a semiconductor fin over a substrate; a first gate stack overlapping with the semiconductor fin in a plan view; a first epitaxial source/drain region adjacent to the first gate stack and extending into the semiconductor fin; a first spacer structure laterally interposed between a sidewall of the first gate stack and the first epitaxial source/drain region, the first spacer structure including: a first L-shaped spacer along the sidewall of the first gate stack; and a second spacer along an outer sidewall of a vertical portion of the first L-shaped spacer, a lateral portion of the first L-shaped spacer extending from an outer sidewall of the second spacer to the first epitaxial source/drain region; and a conductive feature adjacent the first gate stack and in physical contact with a top surface of the first epitaxial source/drain region, a sidewall of the conductive feature being laterally spaced apart from the outer sidewall of the second spacer by a first distance of between about 10 nm and about 25 nm, the sidewall of the conductive feature facing the outer sidewall of the second spacer.

According to yet another embodiment, a device includes: a semiconductor fin extending away from a top surface of a substrate; an active gate stack extending along sidewalls and a top surface of the semiconductor fin, the active gate stack having a first sidewall and a second sidewall opposite to the first sidewall; a first epitaxial source/drain region adjacent to the first sidewall of the active gate stack and extending into the semiconductor fin; a second epitaxial source/drain region adjacent to the second sidewall of the active gate stack and extending into the semiconductor fin; a first spacer structure laterally interposed between the first sidewall of the active gate stack and the first epitaxial source/drain region, the first spacer structure having a first width; and a second spacer structure laterally interposed the second sidewall of the active gate stack and the second epitaxial source/drain region, the second spacer structure having a second width, wherein a ratio of the second width to the first width is between about 0.12 and about 0.33.

According to yet another embodiment, an electrostatic discharge (ESD) protection device includes: a semiconductor fin extending away from a top surface of a substrate; a dummy gate stack overlapping with the semiconductor fin in a plan view; a first active gate stack overlapping with the semiconductor fin in the plan view, the first active gate stack being spaced apart from the dummy gate stack by a first distance in the plan view; a second active gate stack overlapping with the semiconductor fin in the plan view, the second active gate stack being spaced apart from the first active gate stack by a second distance in the plan view; a first epitaxial source/drain region extending into the semiconductor fin and interposed between the dummy gate stack and the first active gate stack in the plan view, the first epitaxial source/drain region being spaced apart from the first active gate stack by a third distance in the plan view; and a second epitaxial source/drain region extending into the semiconductor fin and interposed between the first active gate stack and the second active gate stack in the plan view, the second epitaxial source/drain region being spaced apart from the first active gate stack by a fourth distance in the plan view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a semiconductor fin over a substrate;
   a first gate stack overlapping with the semiconductor fin in a plan view;
   a first epitaxial source/drain region adjacent to the first gate stack and extending into the semiconductor fin;
   a first spacer structure laterally interposed between a sidewall of the first gate stack and the first epitaxial source/drain region, the first spacer structure comprising:
      a first L-shaped spacer along the sidewall of the first gate stack; and
      a second spacer along an outer sidewall of a vertical portion of the first L-shaped spacer, a lateral portion of the first L-shaped spacer extending from an outer sidewall of the second spacer to the first epitaxial source/drain region; and
   a conductive feature adjacent the first gate stack and in physical contact with a top surface of the first epitaxial source/drain region, a sidewall of the conductive feature being laterally spaced apart from the outer sidewall of the second spacer by a first distance of between about 10 nm and about 25 nm, the sidewall of the conductive feature facing the outer sidewall of the second spacer.

2. The device of claim 1, further comprising a second gate stack overlapping with the semiconductor fin in the plan view, the first epitaxial source/drain region being laterally interposed between the first gate stack and the second gate stack.

3. The device of claim 2, wherein the first gate stack has a first width and the second gate stack has a second width, and wherein a ratio of the first width to the second width is between about 0.58 and about 0.8.

4. The device of claim 2, further comprising a second spacer structure laterally interposed between a sidewall of the second gate stack and the first epitaxial source/drain region, the second spacer structure comprising:
   a third L-shaped spacer along the sidewall of the second gate stack; and
   a fourth spacer along an outer sidewall of a vertical portion of the third L-shaped spacer, a lateral portion of the third L-shaped spacer extending from an outer sidewall of the fourth spacer to the first epitaxial source/drain region, wherein the first spacer structure and the second spacer structure have a same width.

5. The device of claim 1, wherein the outer sidewall of the second spacer and a top surface of the lateral portion of the first L-shaped spacer form a first angle, and wherein the first angle is between about 90 degrees and about 120 degrees.

6. A device comprising:
   a semiconductor fin extending away from a top surface of a substrate;
   an active gate stack extending along sidewalls and a top surface of the semiconductor fin, the active gate stack having a first sidewall and a second sidewall opposite to the first sidewall;
   a first epitaxial source/drain region adjacent to the first sidewall of the active gate stack and extending into the semiconductor fin;
   a second epitaxial source/drain region adjacent to the second sidewall of the active gate stack and extending into the semiconductor fin;
   a first spacer structure laterally interposed between the first sidewall of the active gate stack and the first epitaxial source/drain region, the first spacer structure having a first width; and
   a second spacer structure laterally interposed between the second sidewall of the active gate stack and the second epitaxial source/drain region, the second spacer structure having a second width, wherein a ratio of the second width to the first width is between about 0.12 and about 0.33.

7. The device of claim 6, wherein the first width is between about 30 nm and about 40 nm.

8. The device of claim 6, wherein the second width is between about 5 nm and about 10 nm.

9. The device of claim 6, further comprising a dummy gate stack extending along the sidewalls and the top surface of the semiconductor fin, the first epitaxial source/drain region being laterally interposed between the dummy gate stack and the active gate stack.

10. The device of claim 9, further comprising a third spacer structure laterally interposed between a sidewall of the dummy gate stack and the first epitaxial source/drain region, the third spacer structure having the first width.

11. The device of claim 9, wherein a width of the active gate stack is greater than a width of the dummy gate stack.

12. An electrostatic discharge (ESD) protection device comprising:
   a semiconductor fin extending away from a top surface of a substrate;
   a dummy gate stack overlapping with the semiconductor fin in a plan view;

a first active gate stack overlapping with the semiconductor fin in the plan view, the first active gate stack being spaced apart from the dummy gate stack by a first distance in the plan view;

a second active gate stack overlapping with the semiconductor fin in the plan view, the second active gate stack being spaced apart from the first active gate stack by a second distance in the plan view;

a first epitaxial source/drain region extending into the semiconductor fin and interposed between the dummy gate stack and the first active gate stack in the plan view, the first epitaxial source/drain region being spaced apart from the first active gate stack by a third distance in the plan view; and a second epitaxial source/drain region extending into the semiconductor fin and interposed between the first active gate stack and the second active gate stack in the plan view, the second epitaxial source/drain region being spaced apart from the first active gate stack by a fourth distance in the plan view.

13. The ESD protection device of claim 12, wherein the first distance is different from the second distance.

14. The ESD protection device of claim 12, wherein the third distance is different from the fourth distance.

15. The ESD protection device of claim 12, wherein the first distance is greater than the second distance.

16. The ESD protection device of claim 12, wherein a ratio of the second distance to the first distance is between about 0.25 and about 0.47.

17. The ESD protection device of claim 12, wherein the third distance is greater than the fourth distance.

18. The ESD protection device of claim 12, wherein a ratio of the fourth distance to the third distance is between about 0.12 and about 0.33.

19. The ESD protection device of claim 12, wherein the first epitaxial source/drain region is spaced apart from the dummy gate stack by the third distance in the plan view.

20. The ESD protection device of claim 12, wherein the second epitaxial source/drain region is spaced apart from the second active gate stack by the fourth distance in the plan view.

* * * * *